(12) United States Patent
Ishizu

(10) Patent No.: US 9,245,593 B2
(45) Date of Patent: Jan. 26, 2016

(54) METHOD FOR DRIVING ARITHMETIC PROCESSING UNIT

(71) Applicant: SEMICONDUCTOR ENERGY LABORATORY CO., LTD., Atsugi-shi, Kanagawa-ken (JP)

(72) Inventor: Takahiko Ishizu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/514,638

(22) Filed: Oct. 15, 2014

(65) Prior Publication Data

US 2015/0103611 A1 Apr. 16, 2015

(30) Foreign Application Priority Data

Oct. 16, 2013 (JP) .................................. 2013-215208

(51) Int. Cl.
*G11C 5/14* (2006.01)
*G11C 14/00* (2006.01)
*H01L 27/06* (2006.01)
(Continued)

(52) U.S. Cl.
CPC .............. *G11C 5/14* (2013.01); *G11C 14/0054* (2013.01); *G11C 13/0069* (2013.01); *H01L 27/0629* (2013.01); *H01L 27/2463* (2013.01)

(58) Field of Classification Search
CPC ............ H01L 27/2463; H01L 27/0629; G11C 14/0054; G11C 13/0069
USPC ......... 365/226, 149, 154, 174, 181, 188, 190, 365/202
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Fernando Hidalgo
(74) *Attorney, Agent, or Firm* — Fish & Richardson P.C.

(57) ABSTRACT

In a memory cell including an inverter, a capacitor is provided. When the memory cell is not accessed, data stored in the memory cell is copied to the capacitor and then power supply to the inverter is stopped. When the memory cell needs to be accessed, the data is returned from the capacitor to the inverter. In this manner, power consumption when the memory cell is not accessed is reduced. Furthermore, in a memory device including a plurality of such memory cells, backup of the first memory cell and backup of the second memory cell are performed at different timings. Recovery of the first memory cell and recovery of the second memory cell are also performed at different timings. Consequently, power required for backup or recovery can be distributed. Other embodiments may be described and claimed.

18 Claims, 25 Drawing Sheets

(51) Int. Cl.
H01L 27/24 (2006.01)
G11C 13/00 (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,130,234 B2 | 10/2006 | Shionoiri et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,575,985 B2 | 11/2013 | Ohmaru et al. |
| 8,760,903 B2 | 6/2014 | Fujita |
| 8,787,073 B2 * | 7/2014 | Yamazaki et al. ............ 365/154 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0232365 A1 | 9/2013 | Nishijima |
| 2013/0297874 A1 | 11/2013 | Kurokawa |
| 2013/0301331 A1 | 11/2013 | Onuki et al. |
| 2013/0326157 A1 | 12/2013 | Hara |
| 2014/0362635 A1 * | 12/2014 | Erickson et al. ............ 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn—Doped Zinc Indium Oxide Thin Film Transistors for AMOLED Back Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 2000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using Igzo Oxide TFT", SID Digest '08: SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09: SID Digest International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDS", SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTS With a Novel Passivation Layer", SID Digest '09: SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS". IDW '09: Proceeding of the 16th International Display WOrkshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

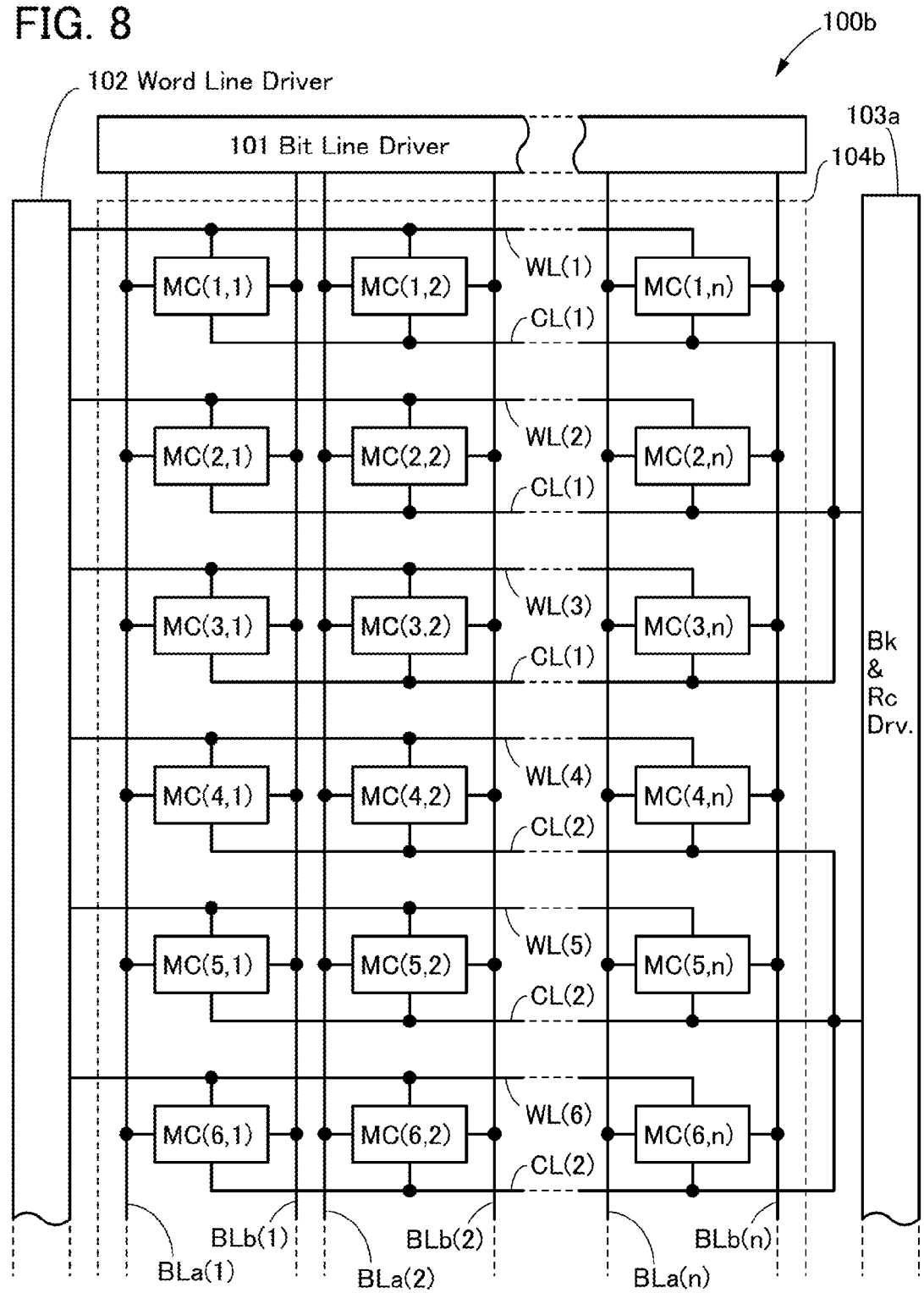

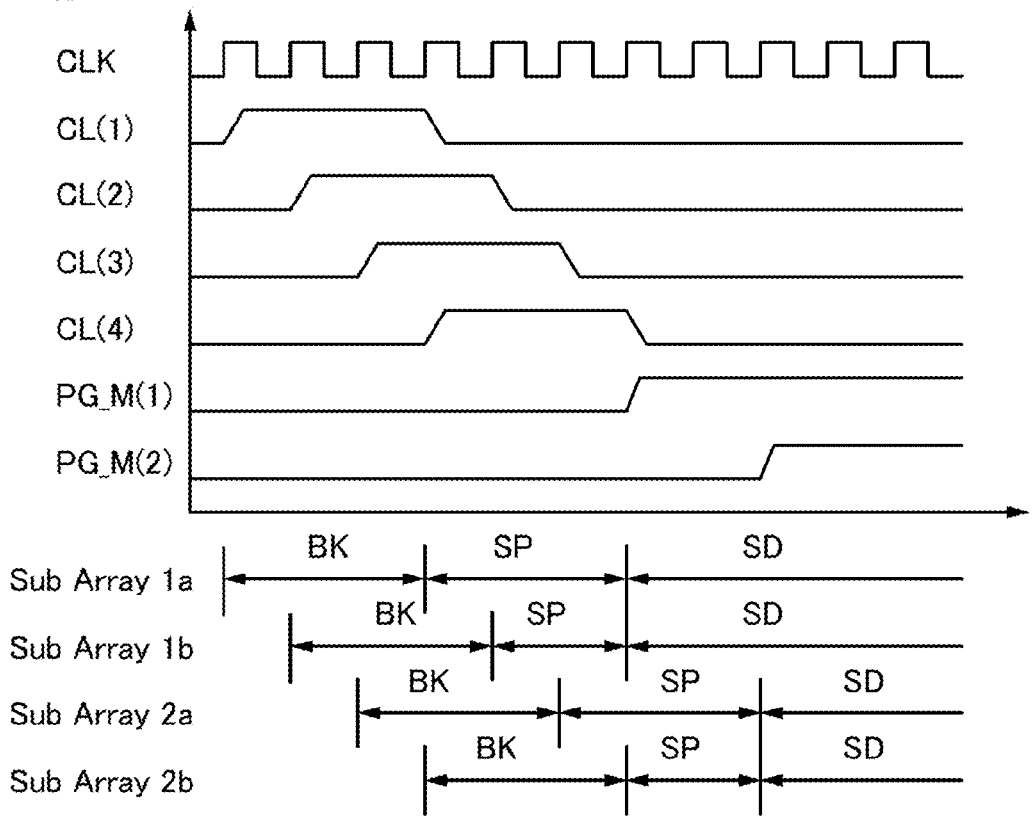
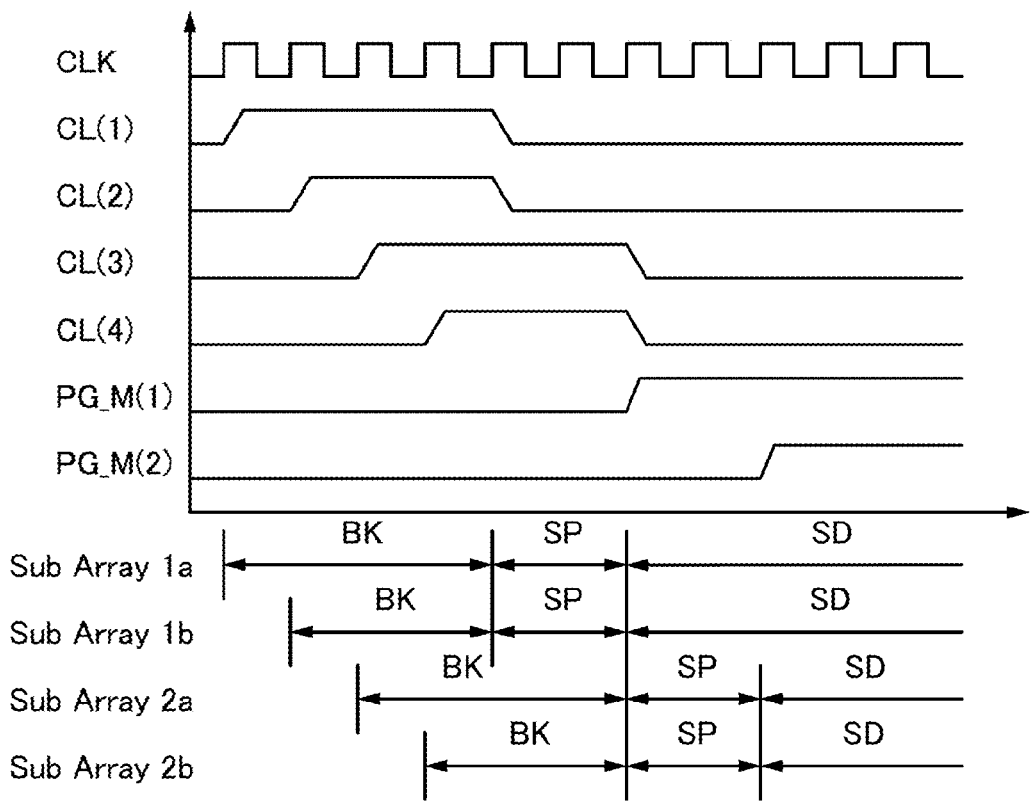

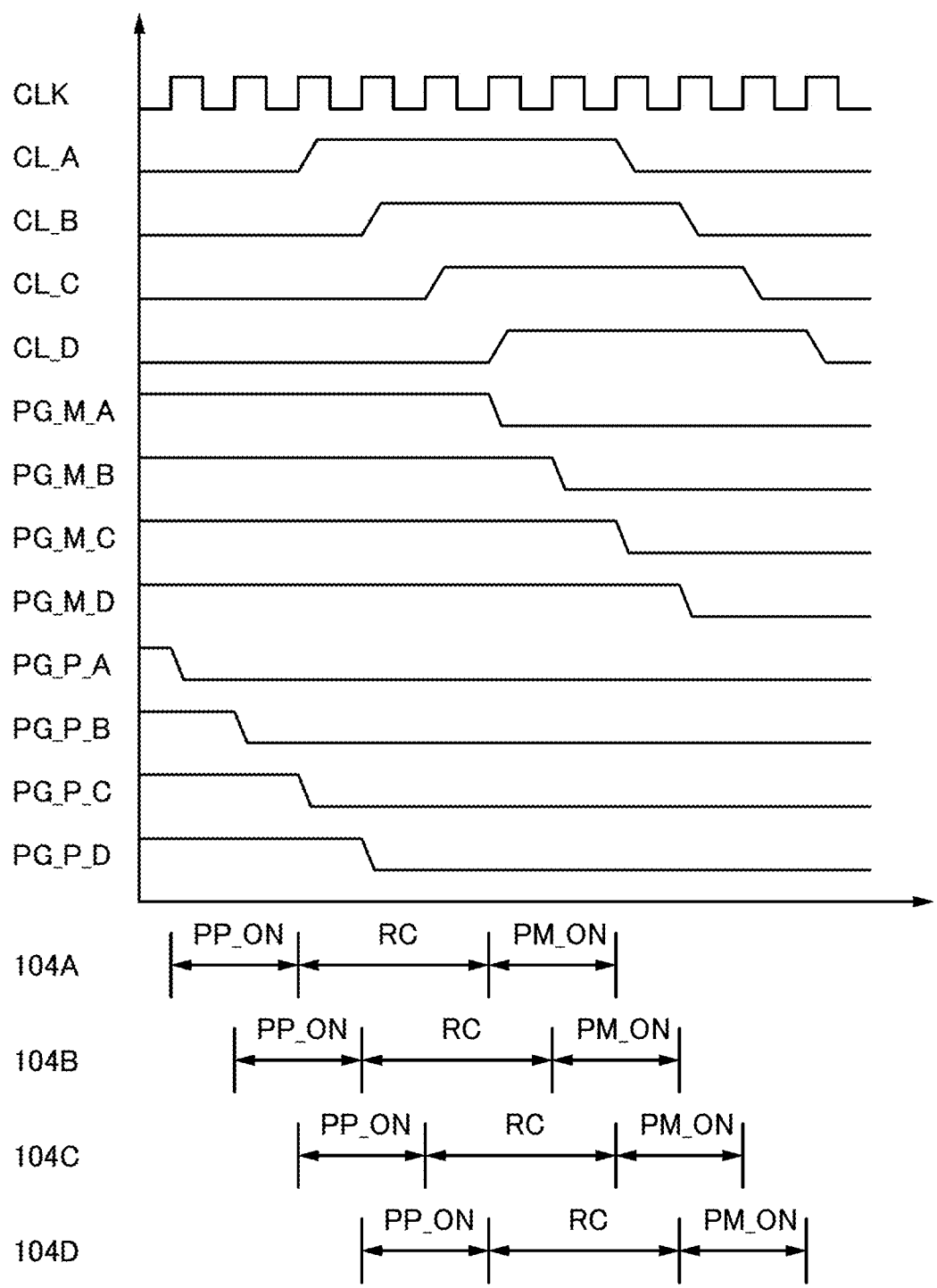

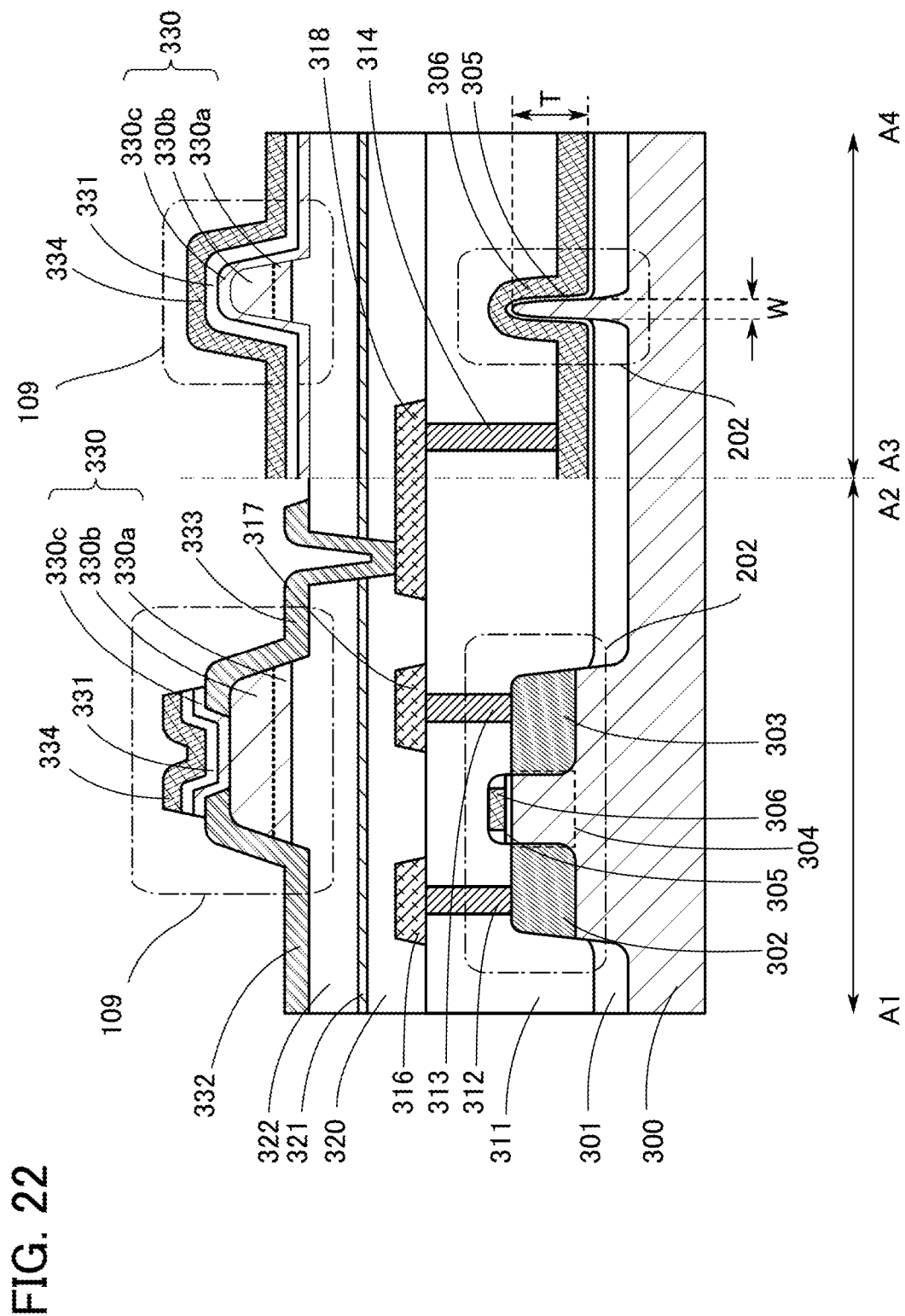

FIG. 23A
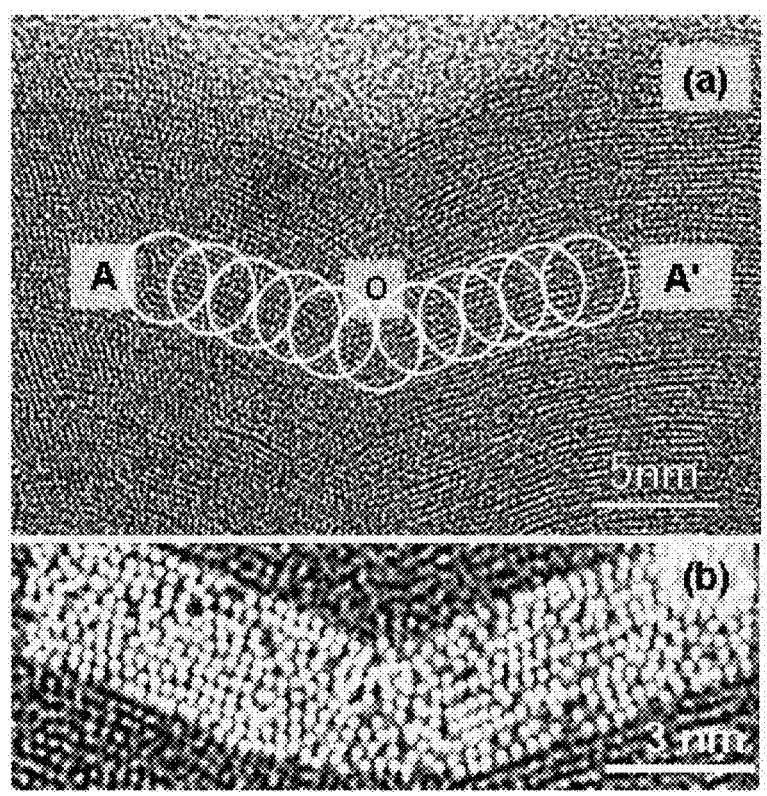
FIG. 23B
FIG. 23C
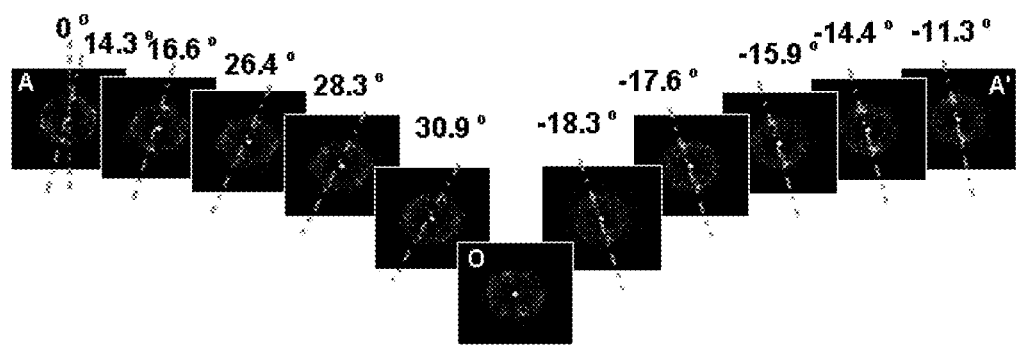

CAAC-OS nc-OS as-sputtered after heat treatment at 450 ° C

METHOD FOR DRIVING ARITHMETIC PROCESSING UNIT

BACKGROUND OF THE INVENTION

1. Field of the Invention

One embodiment relates to an arithmetic processing unit.

2. Description of the Related Art

For arithmetic processing units (e.g., central processing units (CPUs)), an architecture called a stored-program system is employed in many cases. In an arithmetic processing unit using a stored-program system, an instruction and data needed for performing the instruction are stored in a memory device (e.g., a semiconductor memory device), and an instruction and data are sequentially read from the memory device and the instruction is performed.

The memory device includes a main memory device for storing data and instructions and a cache memory which can perform data writing and data reading at high speed. In order to reduce access to a low-speed main memory device and speed up the arithmetic processing, a cache memory is provided in an arithmetic processing unit, between an arithmetic unit (also referred to as an operation part) or a control unit (also referred to as a control part) of the arithmetic processing unit and the main memory unit. In general, a static random access memory (SRAM) or the like is used as a cache memory.

The capacitance of a cache memory provided in an arithmetic processing unit increases year after year. Accordingly, the proportion of power consumption of a cache memory to the total consumption of an arithmetic processing unit remarkably increases; thus, various methods have been suggested in order to reduce power consumption of the cache memory.

For example, a method in which a cache memory is divided into several blocks and the less frequently used blocks (also referred to as lines) acquired by historical information are operated with a low voltage has been suggested. Furthermore, a method for stopping power supply to a cache line which is less likely to be accessed has also been suggested.

Standby of data or the like is required for a cache memory when arithmetic operation is rarely performed. In such a case, power consumption can be reduced by saving data to a memory device with less power consumption and stopping power supply to the cache memory. Data is preferably saved to a device inside the arithmetic processing unit to ensure high-speed response.

For example, Patent Document 1 discloses a structure in which in a cache memory using a volatile memory such as an SRAM and a backup memory with excellent data retention characteristics as compared with a volatile memory, data of the volatile memory is saved (backed up) to the backup memory before power supply is stopped and the data is returned to the volatile memory (recovered) after the power supply is restarted.

REFERENCE

Patent Document

[Patent Document 1] United States Patent Application Publication No. 2013/0232365

SUMMARY OF THE INVENTION

An object of the present invention is at least one of providing an arithmetic processing unit capable of reducing power consumption, a driving method thereof, an architecture thereof, or the like, providing an arithmetic processing unit capable of holding data stably, a driving method thereof, an architecture thereof, or the like, providing a novel arithmetic processing unit (or electronic device), a driving method thereof, an architecture thereof, or the like, or one or plural objects other than the above derived from the description in the specification, the drawings, the claims, and the like.

For example, one embodiment of the present invention is a method for driving an arithmetic processing unit which includes a first memory cell and a second memory cell. Each of the first memory cell and the second memory cell includes a transistor, a capacitor, and an even number of inverters output of each of which is directly or indirectly input to another inverter. Output of one of the even number of inverters is input to the capacitor through the transistor. The method for driving the arithmetic processing unit includes the steps of: turning on the transistor of the first memory cell at a first time; stopping power supply to at least one of the even number of inverters of the first memory cell at a second time; turning on the transistor of the second memory cell at a third time; and stopping power supply to at least one of the even number of inverters of the second memory cell at a fourth time. The first time is earlier than the third time. The second time is earlier than the fourth time. Another embodiment of the present invention is a method for driving the above processing unit, including the steps of: turning on the transistor of the first memory cell at a fifth time; starting power supply to at least one of the even number of inverters of the first memory cell at a sixth time; turning on the transistor of the second memory cell at a seventh time; and starting power supply to at least one of the even number of inverters of the second memory cell at an eighth time. The fifth time is earlier than the seventh time. The sixth time is earlier than the eighth time. Other embodiments may be described and claimed.

According to one embodiment of the present invention, at least one of the following can be achieved: to provide an arithmetic processing unit capable of reducing power consumption, a driving method thereof, an architecture thereof, or the like; to provide an arithmetic processing unit capable of holding data stably, a driving method thereof, an architecture thereof, or the like; to provide a novel arithmetic processing unit (or electronic device), a driving method thereof, an architecture thereof, or the like; or one or plural objects other than the above derived from the description in the specification, the drawings, the claims, and the like.

BRIEF DESCRIPTION OF THE DRAWINGS

In the accompanying drawings:

FIG. 8 shows a configuration example of a memory device;

FIGS. 14A and 14B show operation examples of a memory device;

FIG. 20 shows an operation example of a memory device;

FIG. 22 illustrates an example of a cross-sectional structure of a memory device;

FIGS. 23A to 23C illustrate an example of a structure of an oxide semiconductor;

DETAILED DESCRIPTION OF THE INVENTION

Figure 1A:
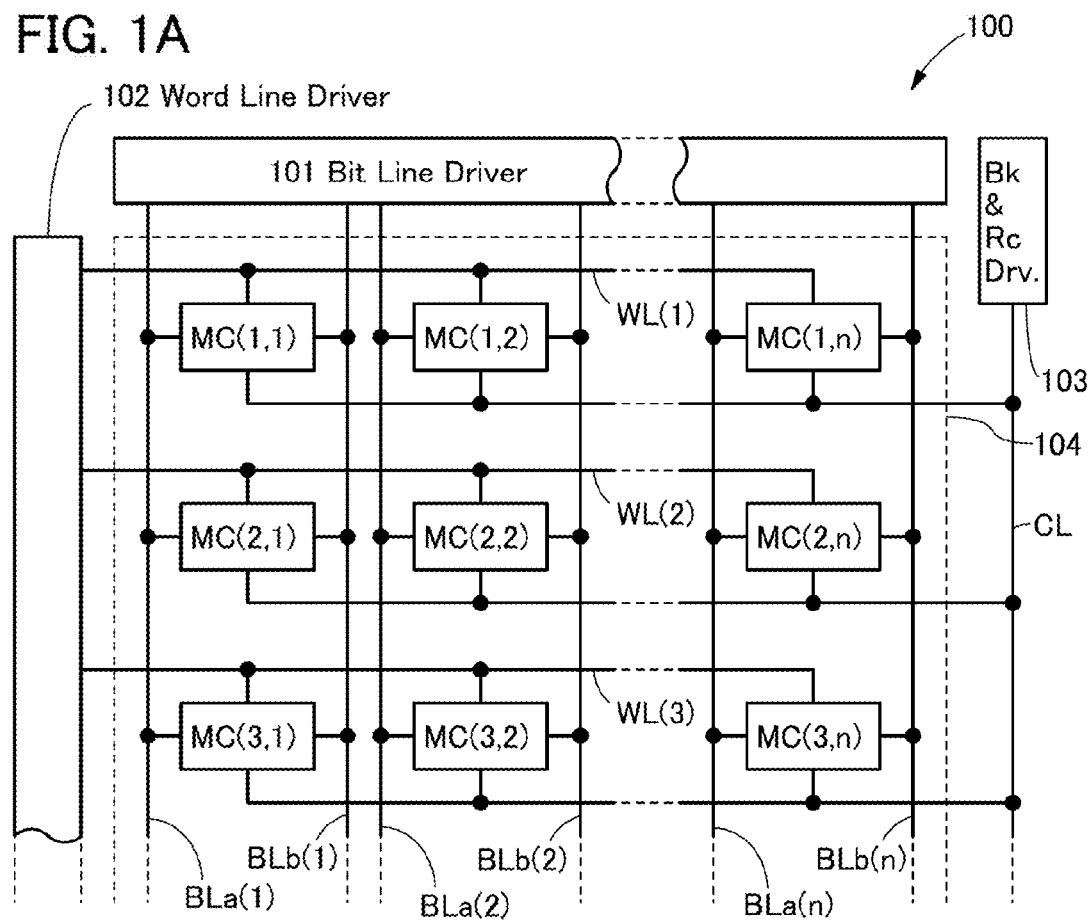
FIGS. 1A and 1B show a configuration example of a memory device.

Hereinafter, embodiments of the present invention will be described in detail with reference to the drawings. Note that the present invention is not limited to the description below, and it is easily understood by those skilled in the art that a variety of modifications can be made to the modes and details without departing from the spirit and scope of the present invention. Therefore, the present invention should not be construed as being limited to the following description of the embodiments. One or more of the following embodiments can be implemented in combination with one or more of the other embodiments as appropriate.

Note that in the following embodiments, the same portions or portions having similar functions are denoted by the same reference numerals in different drawings, and explanation thereof will not be repeated. High and low of a signal are reversed in some cases, depending on a circuit configuration.

Embodiment 1

In this embodiment, configuration examples of a memory device are described with reference to FIGS. 1A and 1B, FIGS. 2A and 2B, FIGS. 3A and 3B, FIG. 4, FIGS. 5A and 5B, FIGS. 6A and 6B, FIGS. 7A and 7B, FIG. 8, FIG. 9, FIG. 10, and FIGS. 11A and 11B. Furthermore, examples of a method for driving the memory device are described with reference to FIGS. 12A to 12C, FIGS. 13A and 13B, FIGS. 14A and 14B, FIGS. 15A and 15B, FIGS. 16A and 16B, and FIG. 17. Although the memory device described in this embodiment is used as a cache memory of an arithmetic processing unit, it is not limited thereto.

FIG. 1A illustrates a configuration of a memory device 100. The memory device 100 includes a bit line driver 101, a word line driver 102, a backup recovery driver 103, and a memory cell array 104.

A plurality of bit lines BLa (BLa(1), BLa(2), . . . , BLa(n), and the like) and a plurality of bit lines BLb (BLb(1), BLb(2), . . . , BLb(n), and the like) are connected to the bit line driver 101, and the bit line driver 101 outputs a signal to the bit lines BLa and the bit lines BLb. A plurality of word lines WL (WL(1), WL(2), WL(3), and the like) are connected to the word line driver 102, and the word line driver 102 outputs a signal to the word lines WL. A control line CL is connected to the backup recovery driver 103, and the backup recovery driver 103 outputs a signal to the control line CL.

In the memory cell array 104, memory cells MC (MC(1, 1), MC(2, 1), MC(3, 1), . . . , MC(1, 2), MC(2, 2), MC(3, 2), . . . , MC(1, n), MC(2, n), MC(3, n), and the like) are arranged in a matrix. Each of the memory cells MC is connected to the bit line BLa, the bit line BLb, the word line WL, and the control line CL.

Figure 1B:
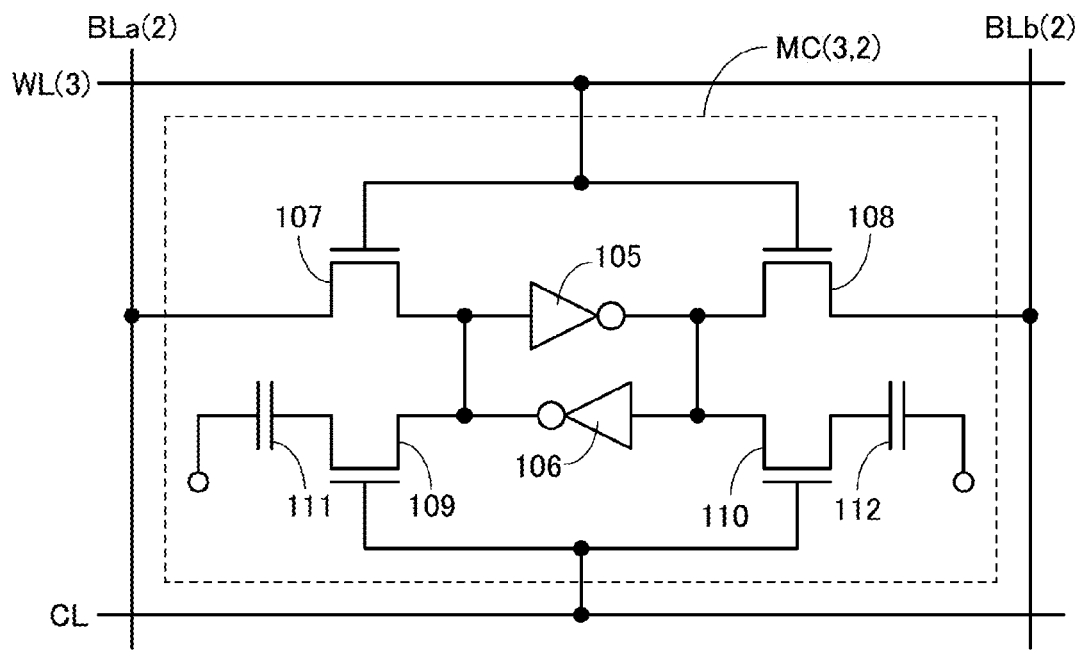

The memory cell MC(3, 2) has, for example, a connection and a circuit configuration illustrated in FIG. 1B. In other words, the memory cell MC(3, 2) is connected to the bit line BLa(2), the bit line BLb(2), the word line WL(3), and the control line CL. The memory cell MC(3, 2) includes an inverter 105, an inverter 106, an access transistor 107, an access transistor 108, a transistor 109, a transistor 110, a capacitor 111, and a capacitor 112. Other memory cells MC also have similar configurations.

Here, a circuit including the inverter 105, the inverter 106, the access transistor 107, and the access transistor 108 has a configuration used in a memory cell of a normal SRAM. Note that the circuit may have a configuration used in a memory cell of an SRAM other than the normal SRAM. The circuit is not limited to an SRAM, and a memory cell including a loop formed of an even number of inverters may be used. A switch, e.g., a transistor, may be provided between the inverters. The transistor 110 and the capacitor 112 are not necessarily provided.

The memory cell MC(3, 2) holds or releases charges stored in the capacitor 111 and the capacitor 112, as disclosed in Patent Document 1, in such a manner that the capacitor 111 and the capacitor 112 are added to a memory cell of a normal SRAM and connection among the capacitors 111 and 112 and the inverters 105 and 106 is controlled by the transistor 109 and the transistor 110 having sufficiently high off resistance. Gates of the transistors 109 and 110 are connected to the control line CL, and with a potential of the control line CL, the transistor 109 and the transistor 110 can be turned on or off.

For example, in the case where the inverter 105 and the inverter 106 are in a certain state, when the transistor 109 is turned on, a potential of an electrode on the transistor 109 side of the capacitor 111 becomes close to an output potential of the inverter 106. As the on resistance of the transistor 109 is smaller and the capacitance of the capacitor 111 is smaller, the potential becomes close to the output potential faster. In this manner, the output potential of the inverter 106 can be copied.

After that, when the transistor 109 is turned off, the potential of the electrode on the transistor 109 side of the capacitor 111 is held for a while. For example, a process for stopping power supply to the inverter 106 causes a shift of a potential of the output of the inverter 106, and the potential of the electrode on the transistor 109 side of the capacitor 111 also shifts accordingly. However, as the off resistance of the transistor 109 is higher and the capacitance of the capacitor 111 is higher, time required for the shift becomes longer.

As disclosed in Patent Document 1, the transistors 109 and 110 may be transistors including any of a variety of oxide semiconductors, and the transistors 109 and 110 are not limited thereto. Other materials, e.g., silicon, may be used. The material can be determined by the capacitances of the capacitors 111 and 112, on resistance, off resistance, or ratios thereof, of the transistors 109 and 110, or a variety of allowable or limited time in a variety of operations of the memory device. A structure in which a film-shaped semiconductor includes a channel formation region is preferable because off resistance can be increased while on resistance is not increased much.

In general, when a semiconductor material having low mobility is used, although the on resistance is high, off resistance is also increased; thus, charges can be held for a longer time. When a ratio of off resistance to on resistance is greater than or equal to a certain value, retention time can be sufficiently long with respect to time required for backup or recovery described below.

Figure 2A:
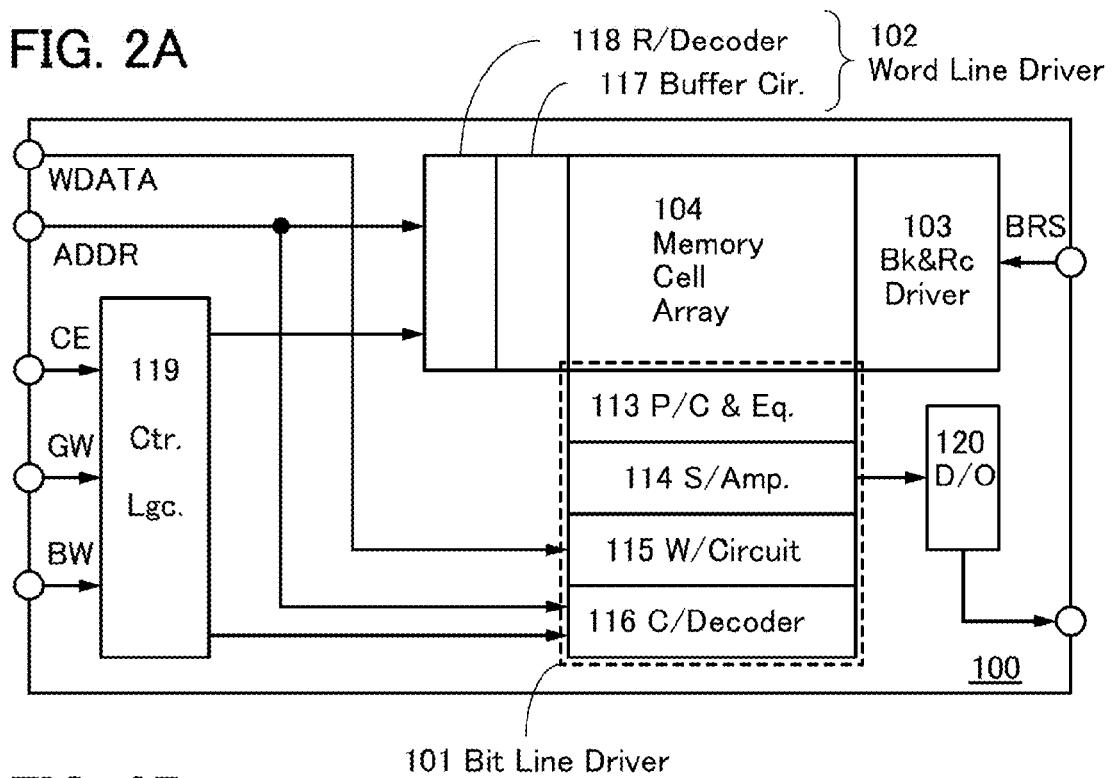
FIGS. 2A and 2B show configuration examples of a memory device.

FIG. 2A shows an example of a path of a signal of (part or the whole of) the memory device 100 shown in FIG. 1A. The bit line driver 101 includes a precharge equalizing circuit 113, a sense amplifier 114, a writing circuit 115, and a column decoder 116. The word line driver 102 includes a buffer circuit 117 and a row decoder 118. The buffer circuit 117 is not necessarily provided. The memory device 100 further includes a control logic circuit 119 and a data output circuit 120.

Write data WDATA, address data ADDR, a chip enable signal CE, a global write enable signal GW, a byte write enable signal BW, and the like are input to the memory device 100. Among them, a chip enable signal CE, a global write enable signal GW, and a byte write enable signal BW are input to the control logic circuit 119. A signal processed by the control logic circuit 119 is not limited thereto, and another control signal may be input as needed. Furthermore, write data WDATA is input to the writing circuit 115. Address data ADDR is input to the column decoder 116 and the row decoder 118. In addition, a backup recovery signal BRS is input to the backup recovery driver 103. Note that in addition to these, a clock signal CLK or another signal may be input. Moreover, all the above signals are not necessarily input.

The control logic circuit 119 processes a chip enable signal CE, a global write enable signal GW, and a byte write enable signal BW and outputs a signal for controlling the column decoder 116 and the row decoder 118, and this signal is input to the column decoder 116 and the row decoder 118. On the basis of these signals, write data WDATA, and address data ADDR, a signal is supplied from the bit line driver 101 to the bit line BLa and the bit line BLb and a signal is supplied from the word line driver 102 to the word line WL. Furthermore, a signal is supplied from the backup recovery driver 103 to the control line CL on the basis of a backup recovery signal BRS. A signal output from the sense amplifier 114 is output from the memory device 100 through the data output circuit 120.

Figure 2B:
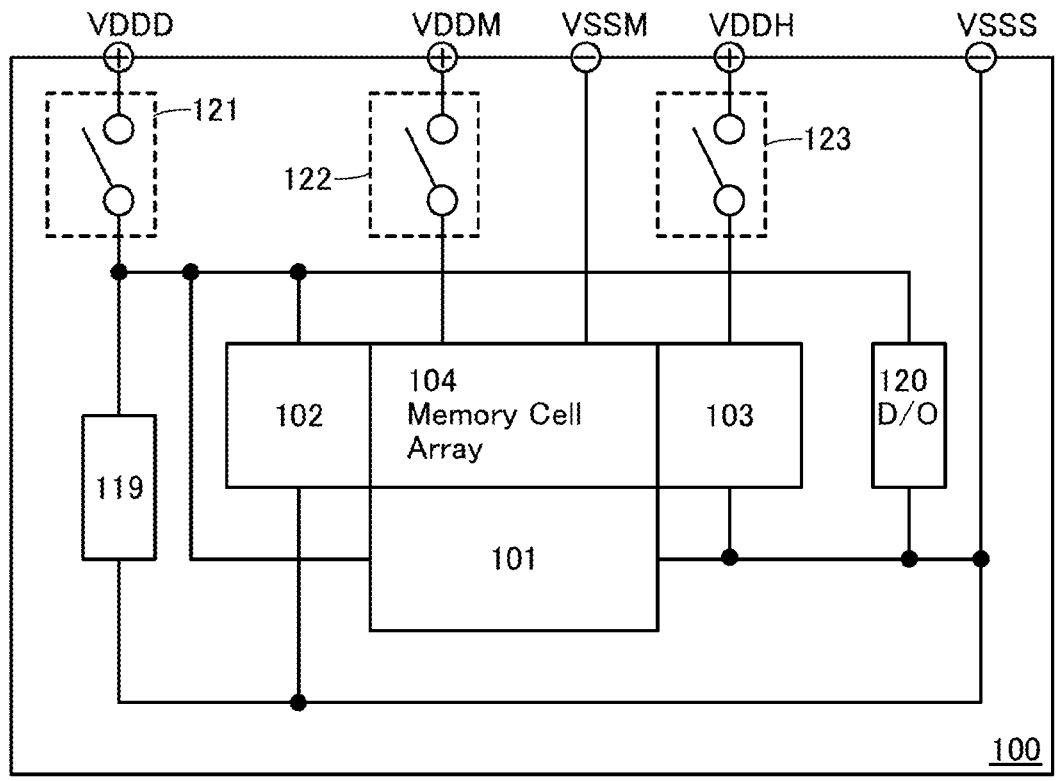

FIG. 2B shows an example of a wiring of a power source of (part or the whole of) the memory device 100 shown in FIG. 1A. The memory device 100 is supplied with a potential VDDH, a potential VDDD, a potential VDDM, a potential VSSM (<the potential VDDM), and a potential VSSS (<the potential VDDD).

For example, the potentials satisfy the following relationship: the potential VDDH>the potential VDDD>the potential VDDM>the potential VSSM>the potential VSSS. In this case, the potential output from the inverter 106 is higher than or equal to the potential VSSM while the potential of the control line CL for turning off the transistor 109 is approximately VSSS, and as compared with the case where the potential VSSM and the potential VSSS are at the same level, the off resistance of the transistor 109 can be high.

The bit line driver 101, the word line driver 102, the control logic circuit 119, and the data output circuit 120 are supplied with the potential VDDD and the potential VSSS, the backup recovery driver 103 is supplied with the potential VDDH and the potential VSSS, and the memory cell array 104 is supplied with the potential VDDM and the potential VSSM.

A power gating switch 121 is provided between a terminal for supplying the potential VDDD and the bit line driver 101, the word line driver 102, the control logic circuit 119, and the data output circuit 120, a power gating switch 123 is provided between a terminal for supplying the potential VDDH and the backup recovery driver 103, and a power gating switch 122 is provided between a terminal for supplying the potential VDDM and the memory cell array 104. One or more of these switches are turned off during time in which reading of data from the memory cell array 104 is not needed or writing of data to the memory cell array 104 is not needed (time in which the memory cell array is not accessed from the outside), so that power consumption can be reduced.

Figure 4:
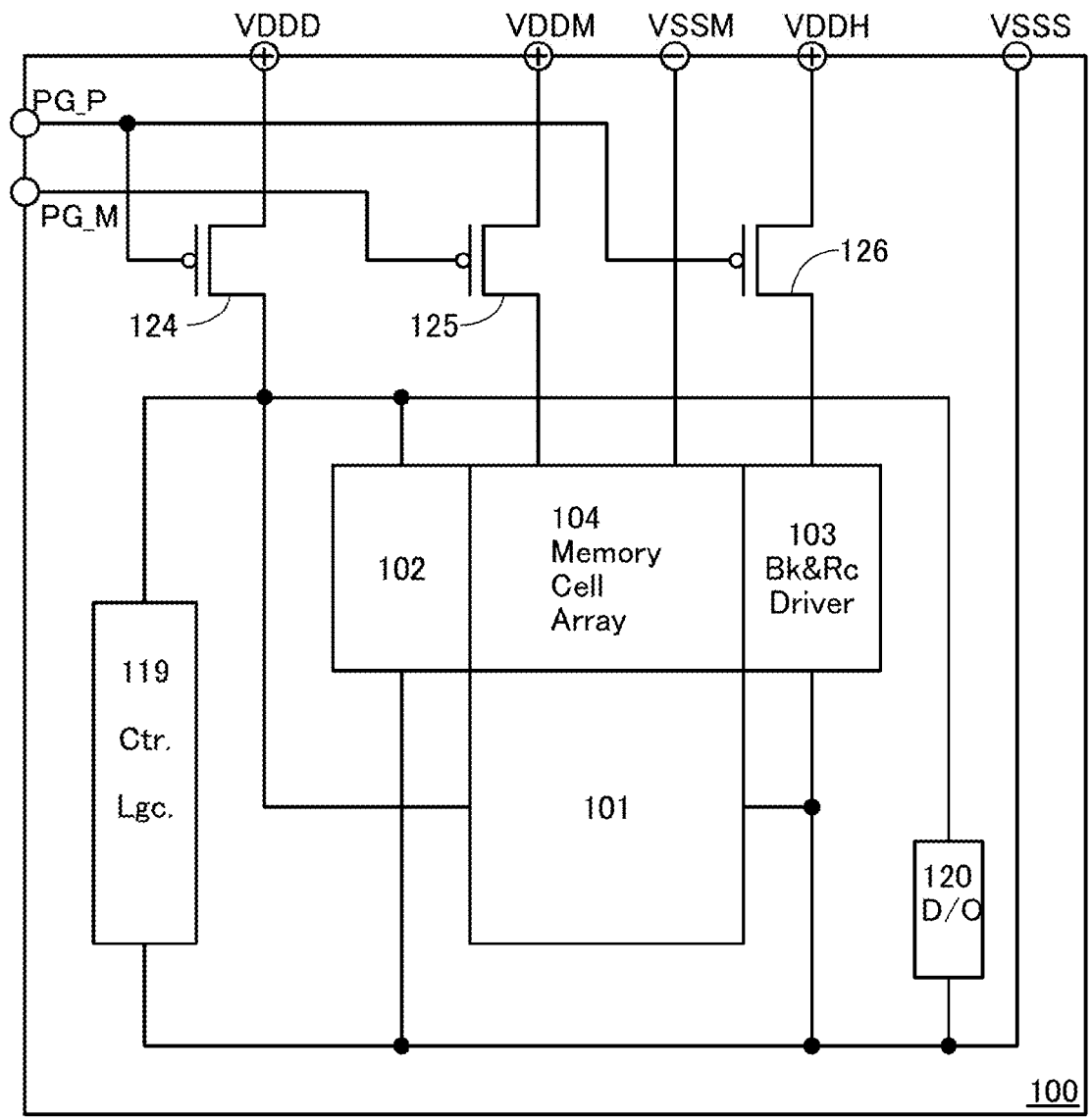
FIG. 4 shows a configuration example of a memory device.

FIG. 4 shows an example where a power gating transistor 124, a power gating transistor 125, and a power gating transistor 126 which are p-type transistors are used as the power gating switch 121, the power gating switch 122, and the power gating switch 123. Gates of the power gating transistors 124 and 126 are supplied with a power gating signal PG_P and a gate of the power gating transistor 125 is supplied with a power gating signal PG_M, whereby the power gating transistors 124 to 126 are turned on or off.

In the following description, since the off resistance of the power gating transistors 124 to 126 is sufficiently high, one or a plurality of the transistors are turned off, so that a potential of corresponding one or plurality of circuits is substantially VSSS or VSSM.

The power gating switches 121 to 123 each may include a plurality of switches controlled independently. For example, as described below, the memory cell array 104 may be divided into a plurality of parts and a plurality of power gating switches 122 may be provided to control power supply to the respective parts.

Figure 3A:
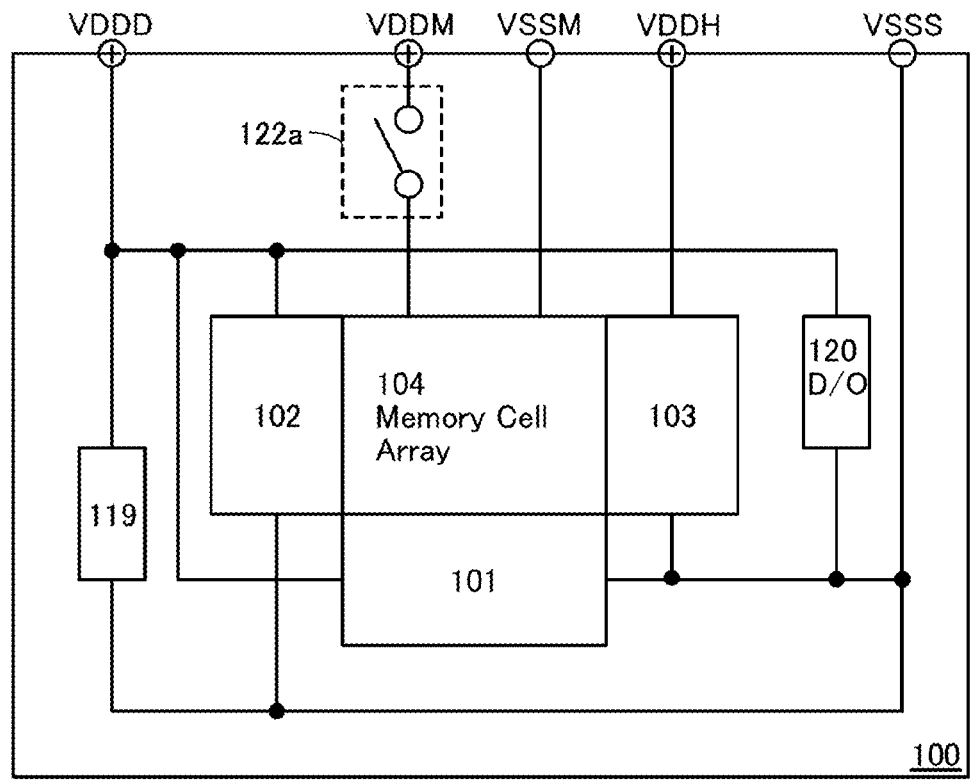
FIGS. 3A and 3B show configuration examples of a memory device.
Figure 3B:
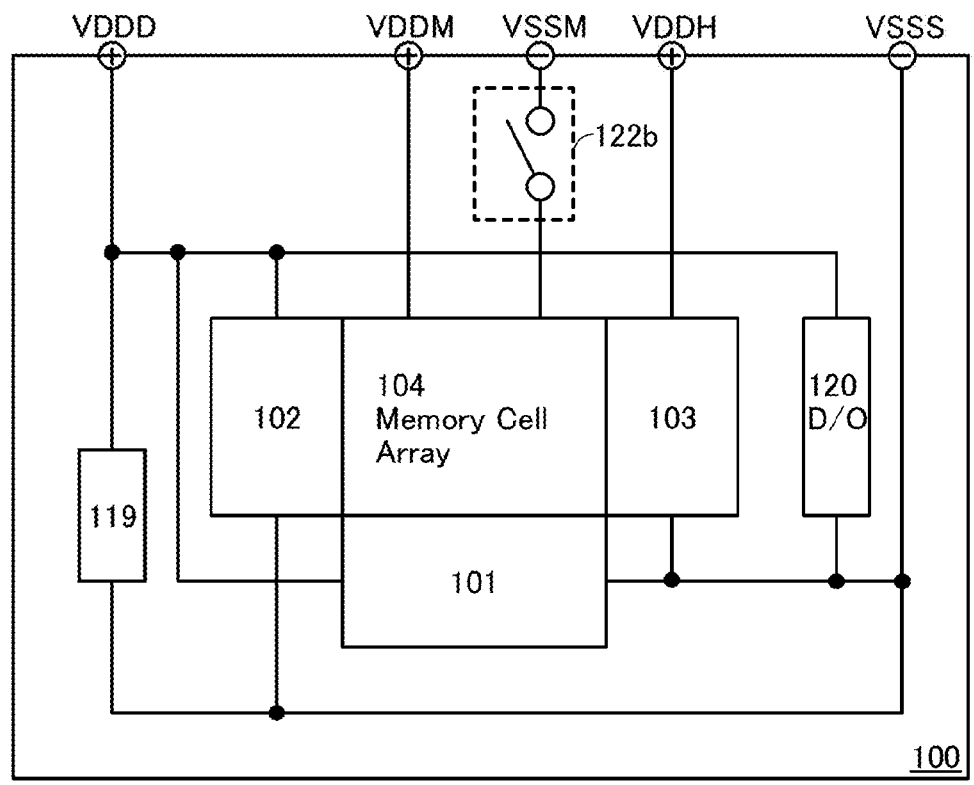

As illustrated in FIG. 3A, the power gating switches 121 and 123 are not provided, and only a power gating switch 122a may be provided. Alternatively, as illustrated in FIG. 3B, a power gating switch 122b may be provided between a terminal for supplying the potential VSSM and the memory cell array 104.

An operation example of the circuits shown in FIGS. 1A and 1B, FIGS. 2A and 2B, and FIG. 4 is described with reference to FIG. 12A.

<Normal Backup Driving>

Figure 12A:
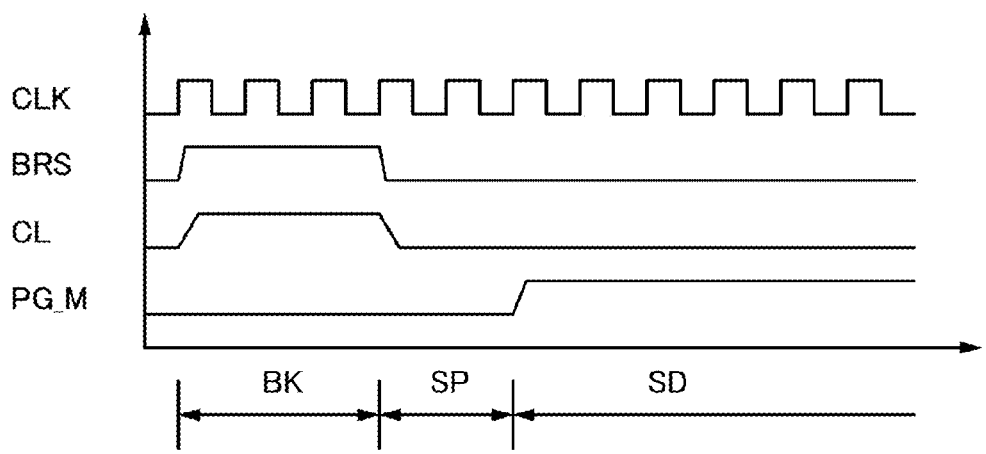
FIGS. 12A to 12C show operation examples of a memory device.

An operation shown in FIG. 12A is, for example, an operation for copying an output potential (data) of the inverter 106 to the capacitor 111 and is also called backup. First, when a backup recovery signal BRS becomes high, a signal is supplied from the backup recovery driver 103 to the control line CL, so that the transistors 109 and 110 of the memory cell MC are turned on. As a result, output potentials of the inverters 106 and 105 are copied to the capacitors 111 and 112 so that backup is performed (in a period BK in FIG. 12A).

After that, the backup recovery signal BRS becomes low and thus the potential of the control line CL is decreased, so that the transistors 109 and 110 of the memory cell MC are turned off.

Furthermore, when the power gating signal PG_M becomes high, the power gating transistor 125 is turned off, so that power supply to the memory cell array 104 is stopped (in a period SD in FIG. 12A).

Note that between the period BK and the period SD, a period SP during which the transistors 109 and 110 are turned off and a state where power supply to the memory cell array 104 is maintained is provided. Although the period BK includes 3 clocks and the period SP includes 2 clocks in FIG. 12A, these periods can be determined as appropriate.

Power supply to circuits other than the memory cell array 104 is stopped similarly; thus, power consumption can be reduced. For example, as shown in FIG. 12B, the power gating signal PG_M is set to a high level and then the power gating signal PG_P is set to a high level, so that the power gating transistors 124 and 126 are turned off; thus, power supply to all the circuits of the memory device 100 can be stopped.

Figure 12B:
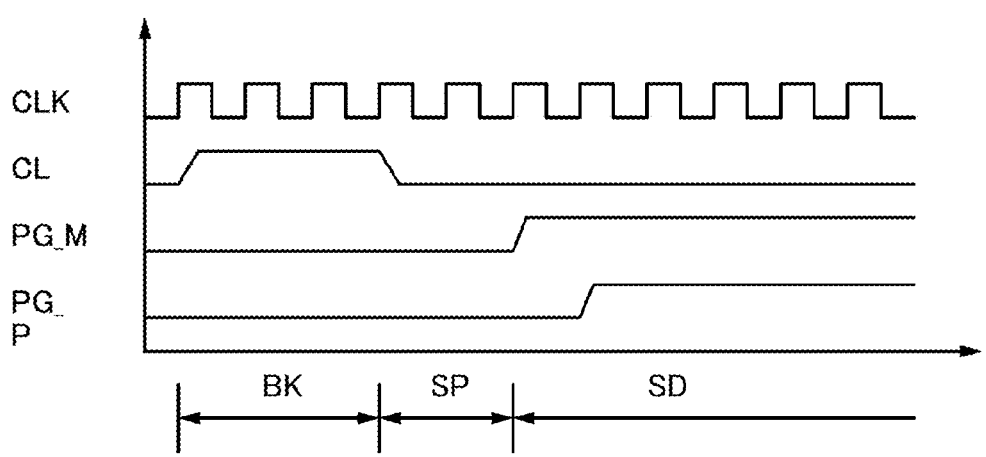

Although FIG. 12B shows an example where one clock after the power gating signal PG_M becomes high, the power gating signal PG_P is set to a high level, the timing may be two clocks or more after that, or the power gating signal PG_M and the power gating signal PG_P may be set to a high level at the same time.

A period during which power supply to the memory cell array 104 is stopped can be determined as appropriate. For example, the period may be 0.1 milliseconds or 10 years at a maximum. As for the maximum period during which power supply is stopped, a time constant determined by off resistance of the transistor 109 and capacitance of the capacitor 111, or off resistance of the transistor 110 and capacitance of the capacitor 112, is preferably taken into consideration.

The power supply is stopped until an arithmetic processing unit provided in the memory device 100, an arithmetic processing unit relating to the memory device 100, or the like needs any operation, which leads to reduction in power consumption of the memory device 100. Note that frequent repetition of stop and restart of power supply increases power consumption in some cases.

<Normal Recovery Driving>

Next, an operation (also referred to as recovery) in which a potential (data) copied to the capacitor 111 through the above operation is returned to a circuit including the inverters 105 and 106 is described with reference to FIG. 15A.

Figure 15A:
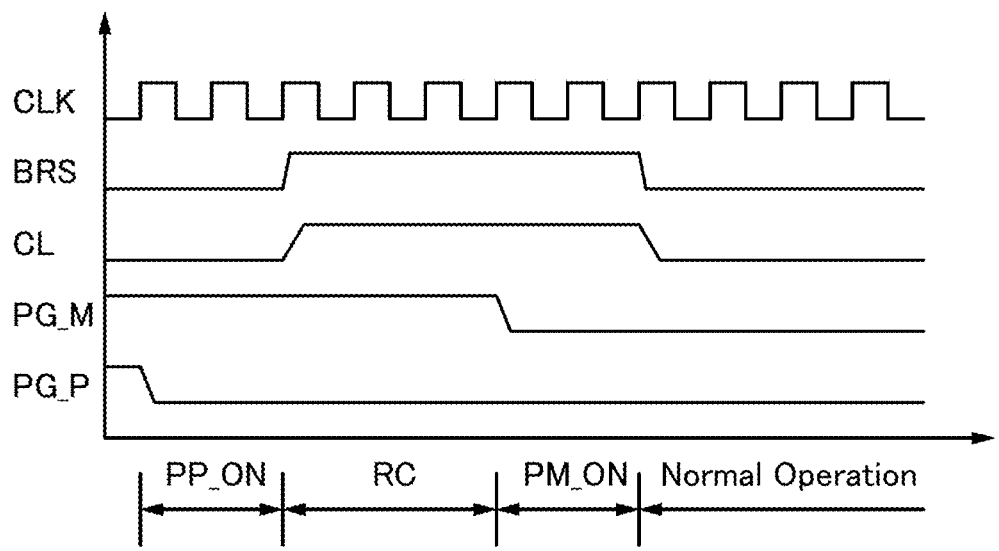
FIGS. 15A and 15B show operation examples of a memory device.

First, if the power gating transistors 124 and 126 are off, the power gating signal PG_P is set to a low level, so that the power gating transistors 124 and 126 are turned on (in a period PP_ON in FIG. 15A). In this state, the power gating transistor 125 is off.

After that, the potential of the control line CL is set to a high level, so that the transistors 109 and 110 are turned on. As a result, charges stored in the capacitor 111 or the capacitor 112 flow to an input terminal of the inverter 105 or the inverter 106, so that the potential of an input terminal of one of the inverters 105 and 106 becomes higher than the potential of an input terminal of the other thereof (in a period RC in FIG. 15A).

In addition, the power gating signal PG_M becomes low, so that the power gating transistor 125 is turned on; thus, power supply to the memory cell array 104 is restarted. The inverters 105 and 106 output potentials corresponding to potentials of input terminals thereof, so that the same state as the state before the backup is obtained (in a period PM_ON in FIG. 15A).

The potential of the control line CL is set to a low level, so that the transistors 109 and 110 are turned off. The following operation is the same as the normal operation. Although the period PP_ON includes two clocks, the period RC includes three clocks, and the period PM_ON includes two clocks in the above example, these periods can be set as appropriate.

Although the operation in which there is one power gating switch 122 (or one power gating transistor 125) is shown above, for example, the memory cell array 104 is divided into a plurality of sub arrays, power gating switches are provided for the respective sub arrays, and the power gating switches are independently controlled in some cases. In that case, control lines which can be independently controlled are provided for the respective sub arrays and backup or recovery of the sub arrays may be controlled.

Figure 5A:
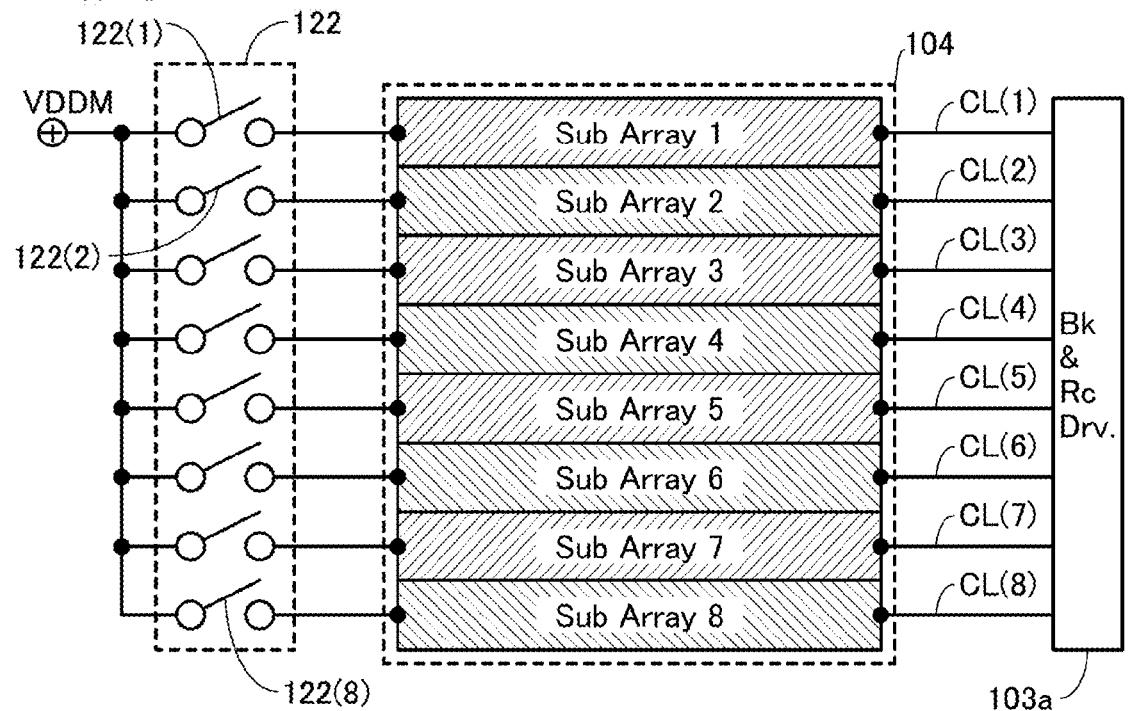
FIGS. 5A and 5B show configuration examples of a memory device.

For example, in the case where sub arrays 1 to 8 are provided every one or more lines of the memory cell array 104 as shown in FIG. 5A, the sub arrays include the power gating switch 122(1), the power gating switch 122(2), . . . , and the power gating switch 122(8), respectively.

Note that the power gating switch 122(1) to the power gating switch 122(8) are controlled by a power gating signal PG_M(1) to a power gating signal PG_M(8), respectively. Here, the power gating switches 122(1) to 122(8) are p-type transistors.

On the other hand, the control lines CL(1) to CL(8) for controlling backup or recovery of the memory cells MC are provided independently in every sub array. The control lines CL(1) to CL(8) are each supplied with an independent signal by the backup recovery driver 103a.

Figure 5B:
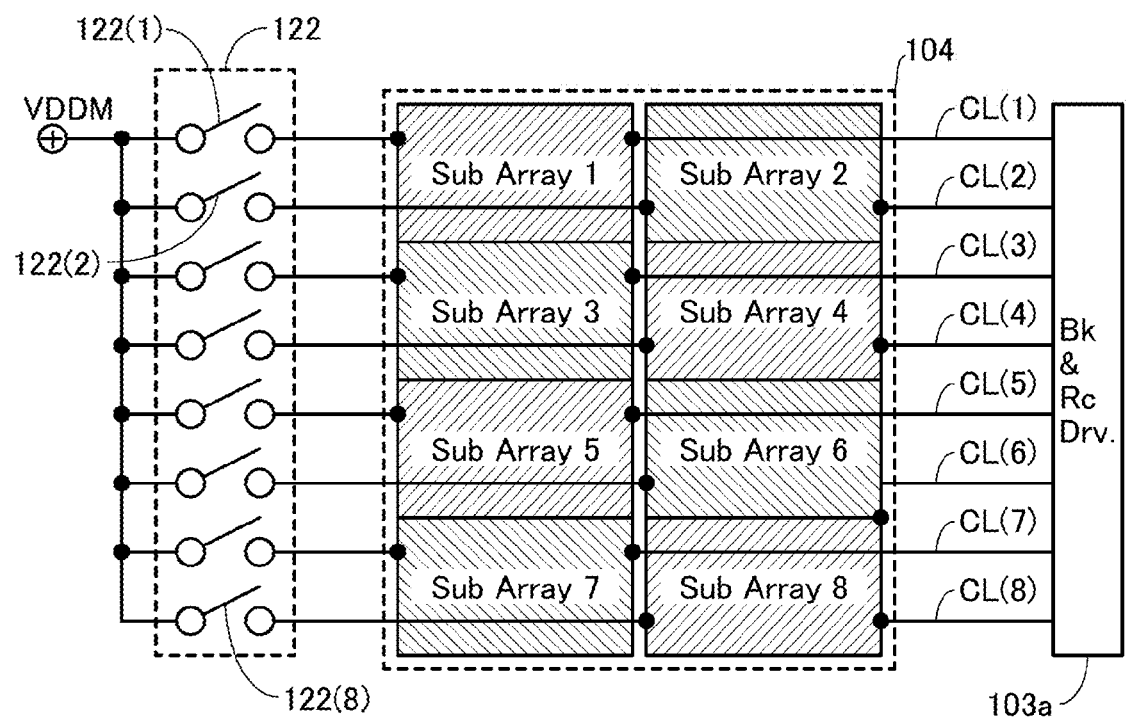

Note that the configuration of the sub array may be a configuration in which, as shown in FIG. 5B, a memory cell belonging to one line belongs to a plurality of sub arrays (e.g., the sub arrays 1 and 2).

Figure 7A:
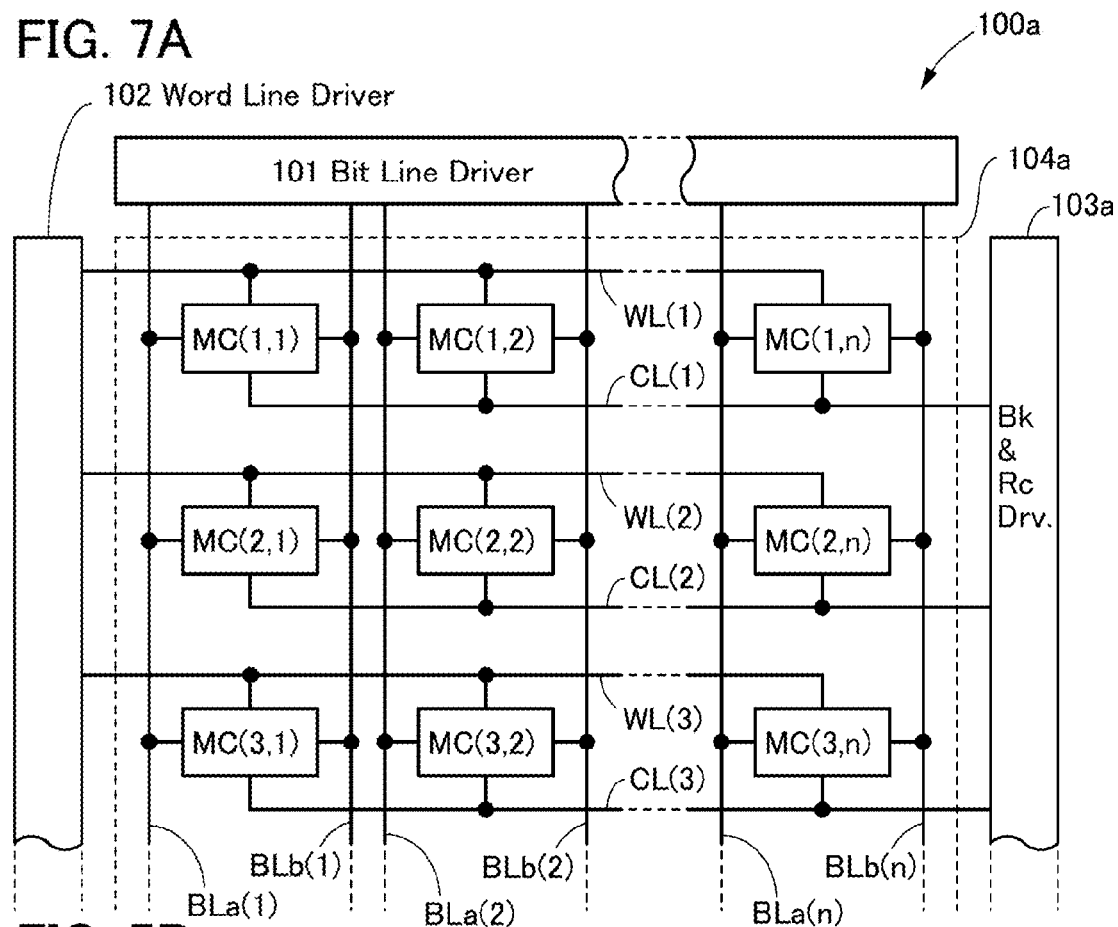
FIGS. 7A and 7B show a configuration example of a memory device.
Figure 7B:
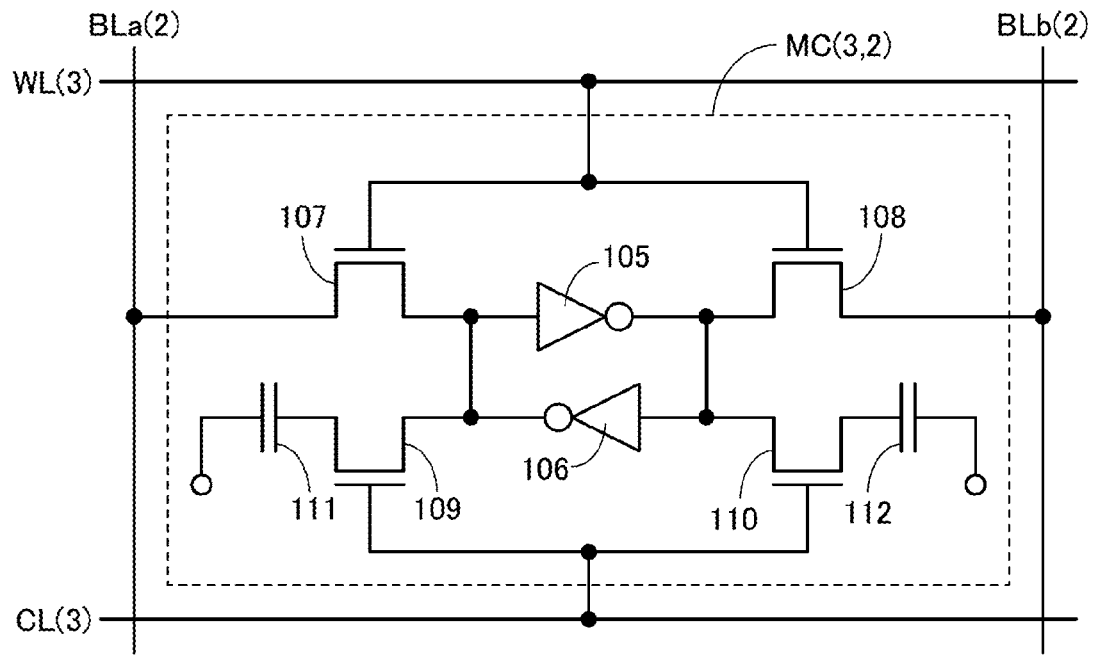

For example, FIG. 7A shows an example where the control line CL is provided in every line. In the memory device 100a, the power gating switch is also provided in every line, and is omitted in the drawing. In the memory cell array 104a, unlike the memory cell array 104 shown in FIG. 1A, each of the memory cells MC is connected to one of the control line CL(1), the control line CL(2), the control line CL(3), . . . . For example, as shown in FIG. 7B, the memory cell MC(3, 2) has the same structure shown in FIG. 1B except for connection to the control line CL(3).

For example, FIG. 8 shows an example where the control line CL is provided in every plurality of lines. A memory device 100b shown in FIG. 8 includes a memory cell array 104b and in the memory cell array 104b, memory cells in the first line (the memory cell MC(1, 1), the memory cell MC(1, 2), . . . , and the memory cell MC(1, n)), memory cells in the second line (the memory cell MC(2, 1), the memory cell MC(2, 2), . . . , and the memory cell MC(2, n)), and memory cells in the third line (the memory cell MC(3, 1), the memory cell MC(3, 2), . . . , and the memory cell MC(3, n)) are included in one sub array. Similarly, memory cells in the fourth line (the memory cell MC(4, 1), the memory cell MC(4, 2), . . . , and the memory cell MC(4, n)), memory cells in the fifth line (the memory cell MC(5, 1), the memory cell MC(5, 2), . . . , and the memory cell MC(5, n)), and memory cells in the sixth line (the memory cell MC(6, 1), the memory cell MC(6, 2), . . . , and the memory cell MC(6, n)) are included in one sub array.

The control lines CL are also controlled independently in every three lines. In other words, the memory cells MC from the first line to the third line are connected to the control line CL(1), and the memory cells MC from the fourth line to the sixth line are connected to the control line CL(2). Note that the power gating switches are also provided in every three lines, and are omitted in the drawing.

Figure 9:
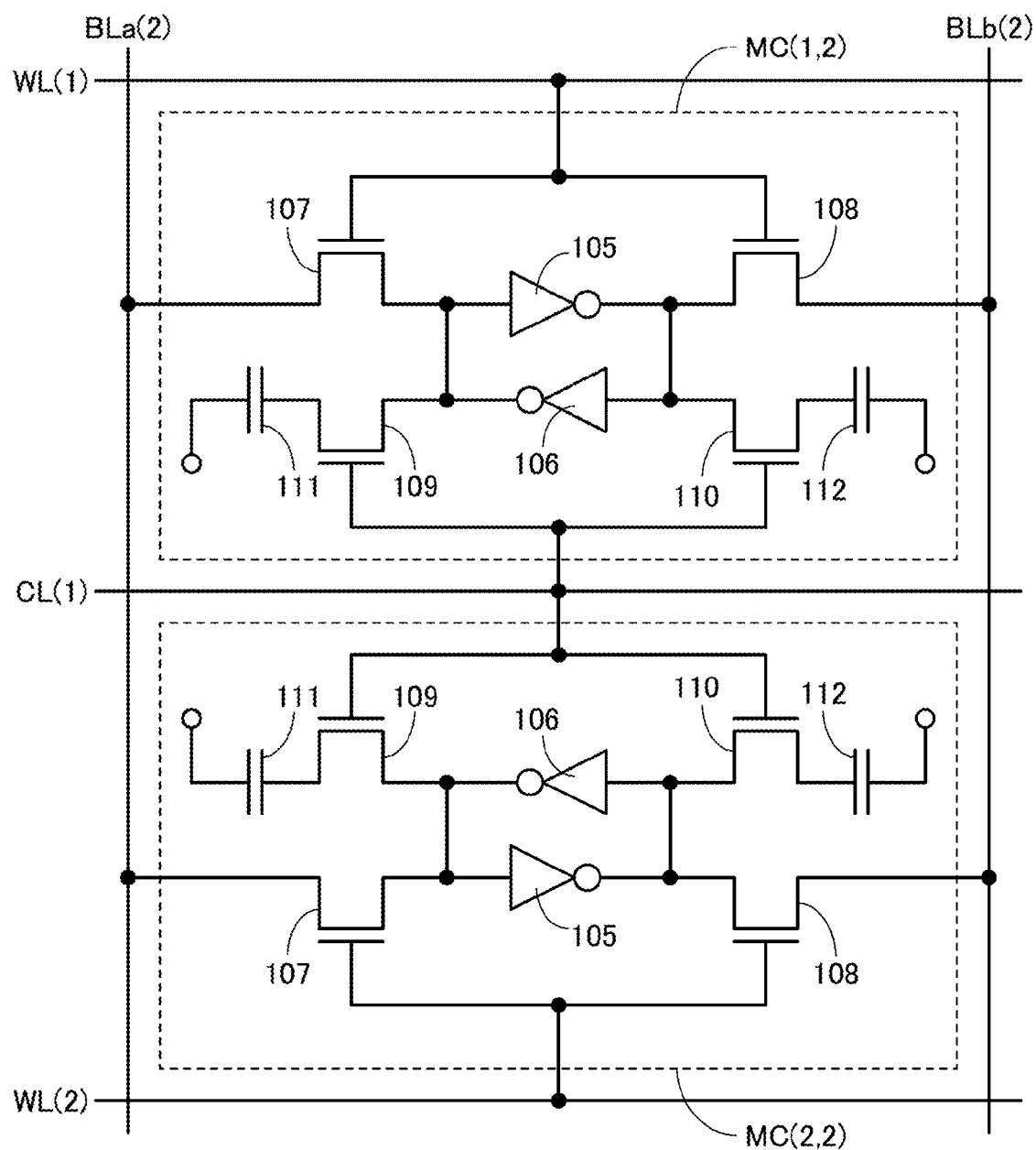
FIG. 9 shows a configuration example of a memory device.
Figure 10:
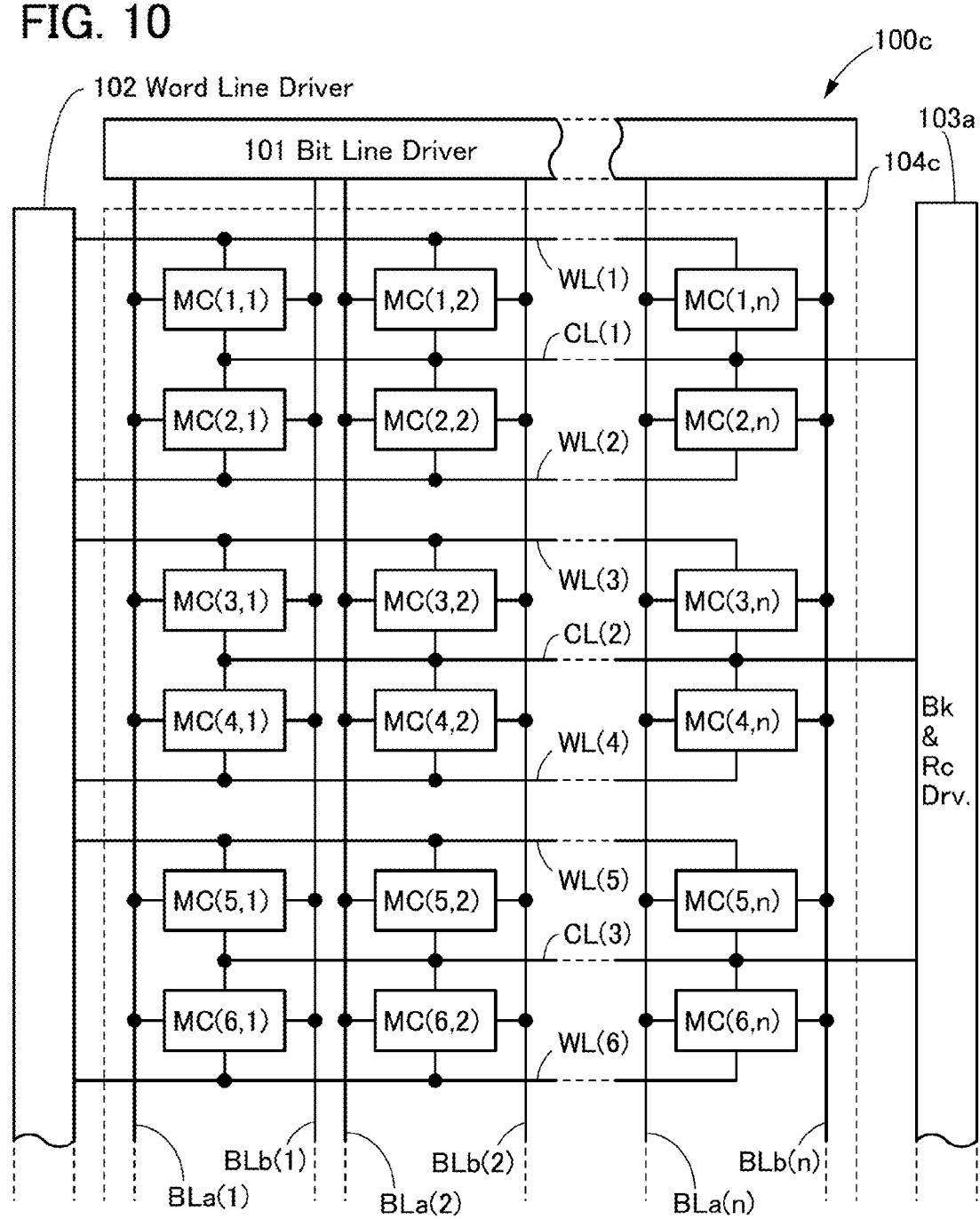
FIG. 10 shows a configuration example of a memory device.

In order to increase the degree of integration, the memory cells MC in adjacent two lines may share one control line CL. For example, as shown in FIG. 9, the control line CL(1) may be provided between the first line and the second line. In a memory device 100c having such a structure, a memory cell array 104c has a structure shown in FIG. 10.

Figure 11A:
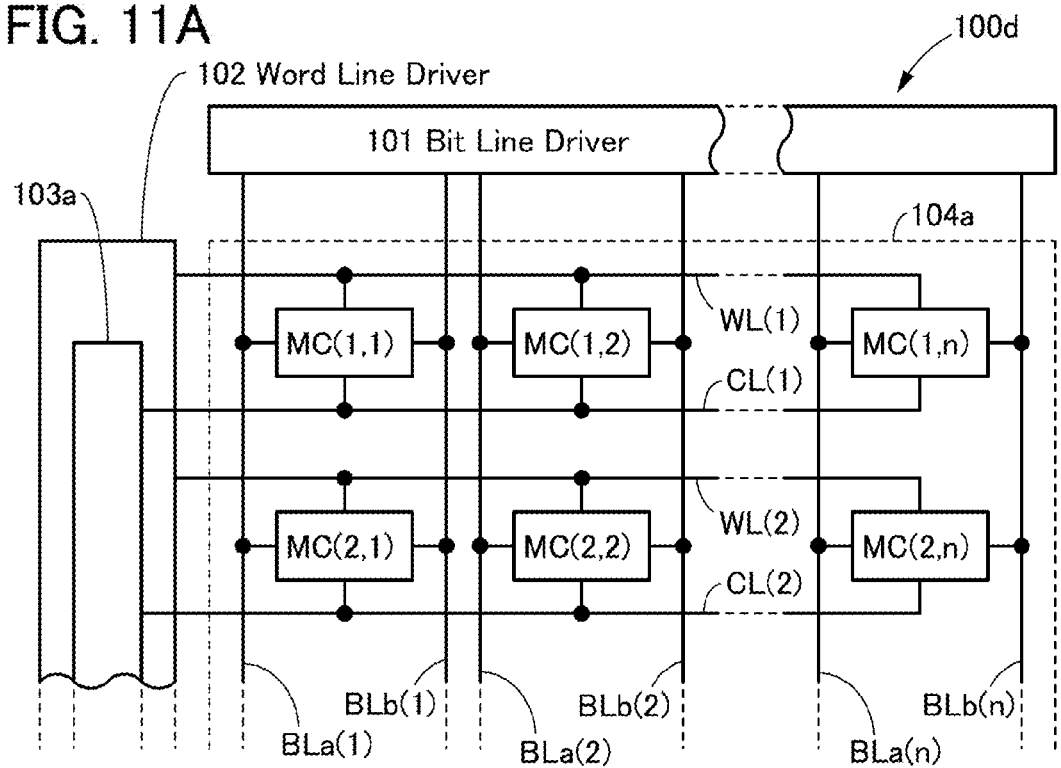
FIGS. 11A and 11B show configuration examples of a memory device.
Figure 11B:
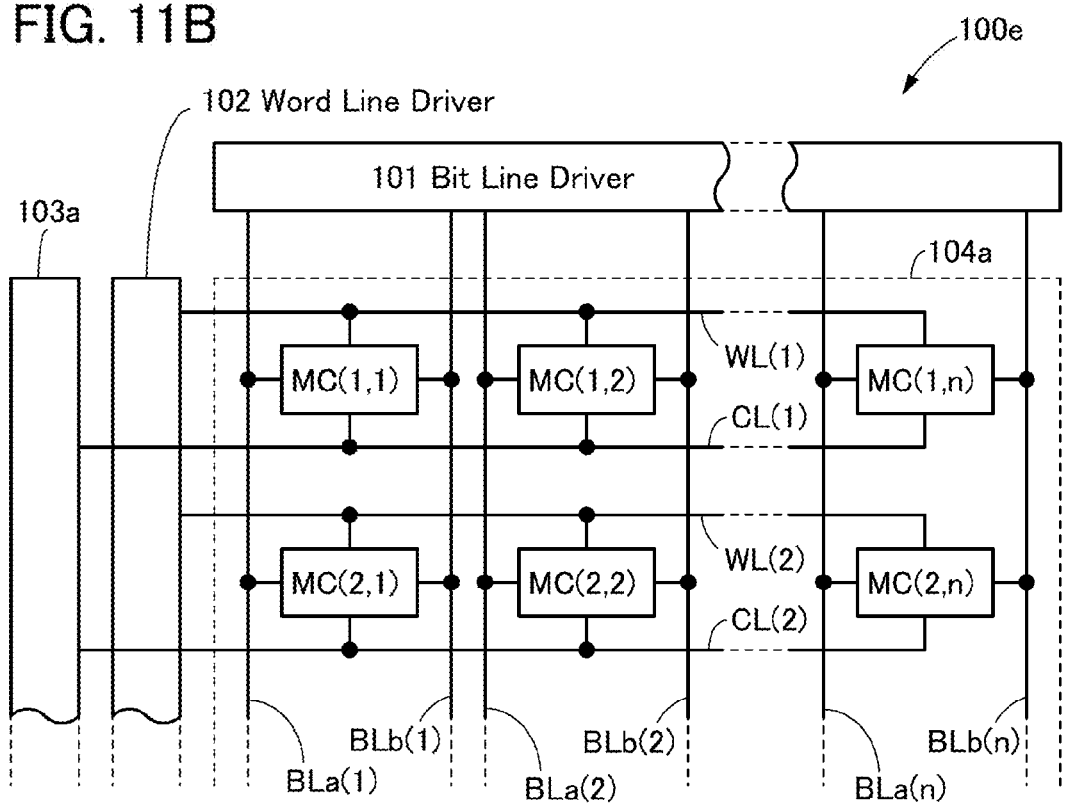

The arrangement example of the backup recovery driver 103a capable of controlling output of the plurality of control lines CL is not limited to the above, and for example, the backup recovery driver 103*a* may be provided inside the word line driver 102 as shown in a memory device 100*d* shown in FIG. 11A, outside the word line driver 102 as shown in a memory device 100*e* shown in FIG. 11B, or although not shown, between the word line driver and the memory cell array, or inside the memory cell array.

Although the control lines CL are provided to be parallel to the word lines WL in the above examples, the control lines CL may be provided to be parallel to the bit lines BLa. In that case, a backup recovery driver may be provided to face the bit line driver with the memory cell array interposed therebetween, provided inside the bit line driver, outside the bit line driver, between the bit line driver and the memory cell array, or inside the memory cell array.

Examples of backup or recovery in the case where the memory cell array includes a plurality of sub arrays and power sources of the sub arrays are independently controlled as described above are shown.

<Normal Multiple Backup Driver>

Figure 12C:
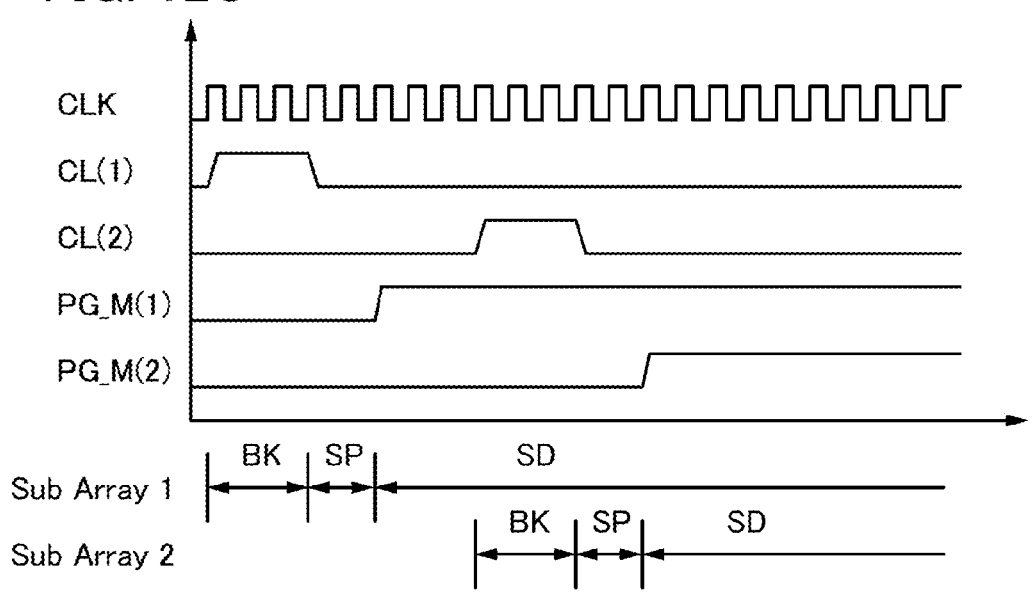

FIG. 12C shows an operation example of backup. Here, although only the sub array 1 and the sub array 2 are described, the same can apply to other sub arrays. In FIG. 12C, the states of the sub arrays 1 and 2 are individually shown.

As shown in FIGS. 5A and 5B, power supply to the sub array 1 is controlled by the power gating switch 122(1) and backup or recovery of the sub array 1 is controlled by the control line CL(1). The same applies to the sub array 2. The control lines CL(1) and CL(2) are supplied with a signal from the backup recovery driver 103*a*.

First, by setting the potential of the control line CL(1) to a high level, the transistors 109 and 110 are turned on in the memory cell MC of the sub array 1 so that backup of the memory cell MC of the sub array 1 is performed. Then, two clocks after the potential of the control line CL(1) is set to a low level, the power gating signal PG_M(1) is set to a high level, so that the power gating switch 122(1) is turned off. The above process is the same as that in FIG. 12A. As a result, power supply to the sub array 1 is stopped.

Next, by setting the potential of the control line CL(2) to a high level, the transistors 109 and 110 in the memory cell MC of the sub array 2 are turned on so that backup of the memory cell MC of the sub array 2 is performed. Then, two clocks after the potential of the control line CL(2) is set to a low level, the power gating signal PG_M(2) is set to a high level, so that the power gating switch 122(2) is turned off.

Backup of the sub arrays 3 to 8 can be similarly performed. Although the period BK includes three clocks and the period SP includes two clocks in this example, these periods can be set as appropriate in a manner similar to that in FIG. 12A. When backup of all the sub arrays is finished, the power gating switch 121 or the power gating switch 123 may be turned off.

<Normal Multiple Recovery Driving>

Figure 15B:
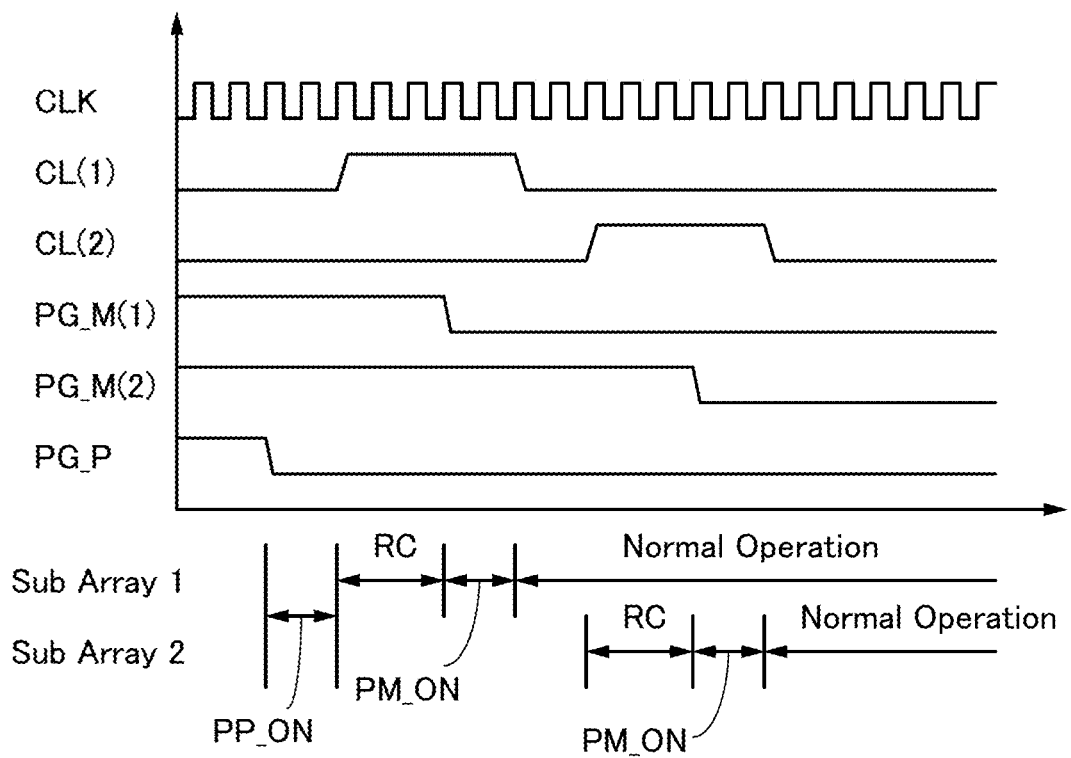

Next, FIG. 15B shows an example of recovery. In FIG. 15B, the states of the sub arrays 1 and 2 are individually shown. If the power gating switch 121 or the power gating switch 123 is off first, the power gating signal PG_P is set to a low level, so that the power gating switch 121 or the power gating switch 123 is turned on.

Then, the potential of the control line CL(1) is set to a high level so that recovery is started. Three clocks after the potential of the control line CL(1) is set to a high level, the power gating signal PG_M(1) is set to a low level, so that the power gating switch 122(1) is turned on. Two clocks after that, the potential of the control line CL(1) is set to a low level. Through the above process, recovery of the memory cell MC of the sub array 1 is finished.

Two clocks after that, the potential of the control line CL(2) is set to a high level so that recovery is started. Three clocks after the potential of the control line CL(2) is set to a high level, the power gating signal PG_M(2) is set to a low level, so that the power gating switch 122(2) is turned on. Two clocks after that, the potential of the control line CL(2) is set to a low level. Through the above process, recovery of the memory cell MC of the sub array 2 is finished.

Recovery of the sub arrays 3 to 8 can be similarly performed. Although the period RC includes three clocks and the period PM_ON includes two clocks in this example, these periods can be set as appropriate in a manner similar to that in FIG. 15A.

Power consumption can be more likely to be decentralized by performing backup or recovery of every sub array as described above than the case where backup or recovery of all the memory cells MC in the memory cell array 104 is performed at the same time as shown in FIG. 12A. Power consumption in a backup process is caused by injection of charges to the capacitor 111 or the capacitor 112 and shift of a potential of the control line CL. The number of capacitors 111 or the capacitors 112 is increased in accordance with the number of memory cells of the memory device 100. Furthermore, power consumption in a recovery process is caused by shift of the potential of the control line CL or the like.

For example, in the case where the memory device 100 has 10 Mbits and the capacitance of the capacitor 111 or the capacitor 112 is 1 fF, when the potential between electrodes of the capacitor 111 or the capacitor 112 of all the memory cells MC is necessarily shifted by 1 V, charges of $2 \times 10^{-8}$ C are necessarily moved. For example, when on resistance of the transistor 109 and the transistor 110 is $10^{+6} \Omega$, charges are moved between the memory device 100 and the outside in approximately 1 nanosecond; thus, a current of 20 A flows instantaneously.

Actually, data is not rewritten to all the memory cells MC in backup (data of all the memory cells is not changed after backup) and many memory cells maintain the same potentials as before; thus, the number of memory cells which are required for charge movement is one several of the entire memory cell. Furthermore, since rising of the potential of the control line CL is slow, movement of charges takes long time. Even in that case, a current of approximately 1 A is instantaneously required in some cases.

Since the control line CL has large capacitance as a whole, a large amount of charges is necessarily moved in order to increase or decrease the potential. In the case where the time is short, a large amount of current instantaneously flows.

Such a large current imposes a heavy burden on a power source of an arithmetic processing unit; thus, decrease in voltage or the like is caused in some cases. This might be a factor of a default of backup. Furthermore, this might be a factor of deformation, a break, or the like caused by an excess current flowing in a wiring.

Therefore, backup is performed not in the entire memory cell array 104 but in some regions (e.g., sub arrays), which is effective in avoiding an instantaneously large current.

Figure 13A:
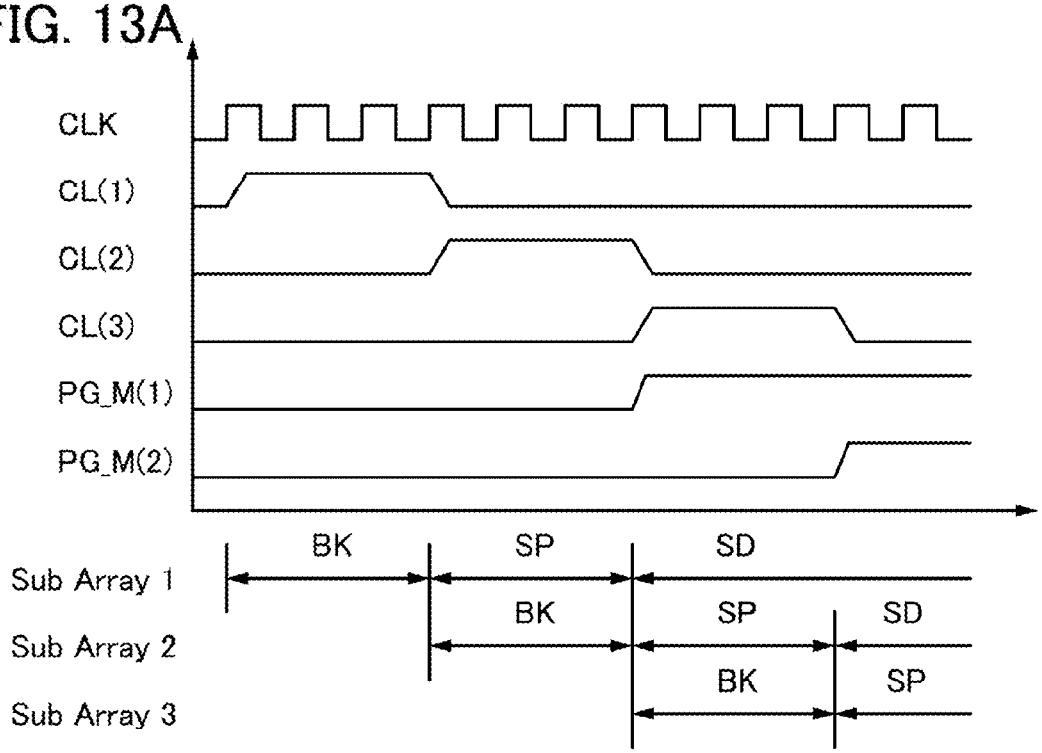
FIGS. 13A and 13B show operation examples of a memory device.

Note that there is a possibility that a large current flows particularly in an early initial time of the period BK, and other periods are not necessarily considered. An example which is focused on it is shown in FIG. 13A.

<Pipeline Backup Driving>

In an example shown in FIG. 13A, before the sub array 1 is shut down, backup of another sub array is performed; for example, backup of the sub array 2 is performed subsequently to the end of backup of the sub array 1.

Here, in each of the sub arrays, the period BK and the period SP each include three clocks. The period BK of the sub array 2 is started at substantially the same time as the end of the period BK of the sub array 1, and the period BK of the sub array 3 is started at substantially the same time as the end of the period BK of the sub array 2. Similarly, the period SP of the sub array 2 is started at substantially the same time as the end of the period SP (i.e., the start of the period SD) of the sub array 1, and the period SP of the sub array 3 is started at substantially the same time as the end of the period SP (i.e., the start of the period SD) of the sub array 2. Backup or the like of other sub arrays is performed in a similar manner.

For example, a period between the start of backup of the sub array 1 and the shut down of the sub array 2 is approximately nine clocks, which is shorter than that in the method shown in FIG. 12C (approximately 13 clocks).

Although in FIG. 13A, the period BK and the period SP each include three clocks, the numbers of the clocks are not necessarily the same, and each period may be set as appropriate. In FIG. 13A, the period BK of the sub array 2 is started at substantially the same time as the end of the period BK of the sub array 1; however, the start of the period BK of the sub array 2 is not necessarily after the end of the period BK of the sub array 1, and the period BK of the sub array 2 may be started in the middle of the period BK of the sub array 1.

<Super Pipeline Backup Driving>

Figure 13B:
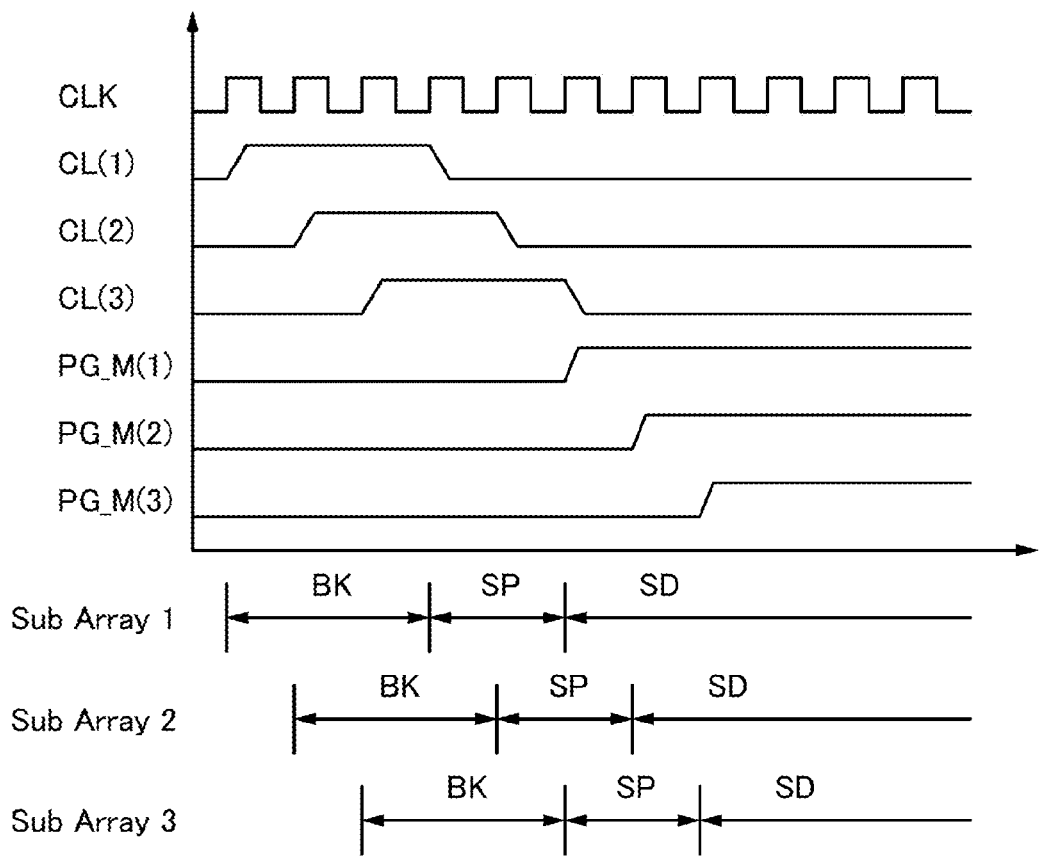

In an example shown in FIG. 13B, as in FIGS. 12A to 12C, the period BK includes three clocks and the period SP includes two clocks in each sub array. Furthermore, in the example shown in FIG. 13B, one clock after the start of the period BK of the sub array 1, the period BK of the sub array 2 is started. Since a period during which a large current flows is an early time of the period BK as described above, the periods are determined so that the early times thereof do not overlap with each other.

In this example, a period between the start of backup of the sub array 1 and the shut down of the sub array 2 is approximately six clocks.

<Super Pipeline Recovery Driving>

Next, an example of recovery is described with reference to FIG. 16A. Here, recovery of the sub array 1 is started by setting the potential of the control line CL(1) to a high level, and then, recovery of the sub array 2 is started by setting the potential of the control line CL(2) to a high level one clock after the recovery of the sub array 1 is started. As in the case in FIG. 15A, the period RC includes three clocks and the period PM_ON includes two clocks; however, the period RC and the period PM_ON may have the same number of clocks.

In this example, an period between the start of the recovery of the sub array 1 and the normal operation of the sub array 2 is approximately six clocks, which is shorter than that in the method shown in FIG. 15B (approximately 12 clocks).

As the number of control lines CL capable of being independently controlled is increased, current consumption in backup or recovery is distributed. Thus, in the example in FIG. 5A or FIG. 5B, one sub array is provided with one control line CL, and for example, as shown in FIG. 6A or FIG. 6B, one sub array may be provided with a plurality of control lines CL.

Figure 6A:
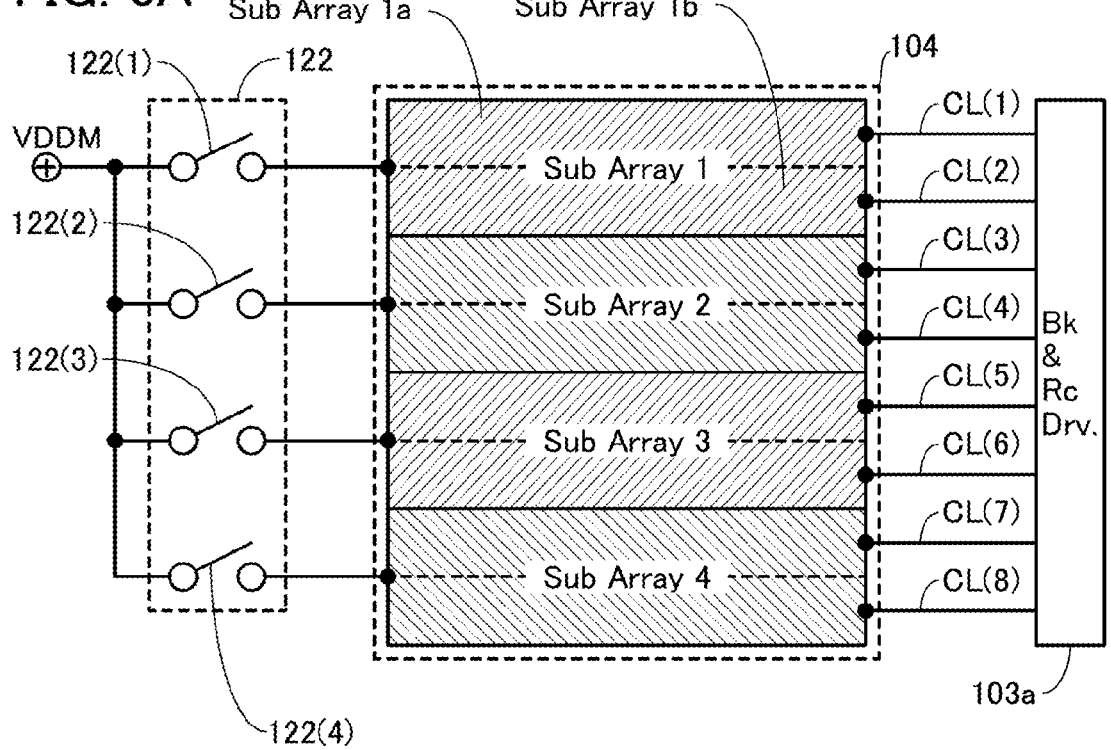
FIGS. 6A and 6B show configuration examples of a memory device.
Figure 6B:
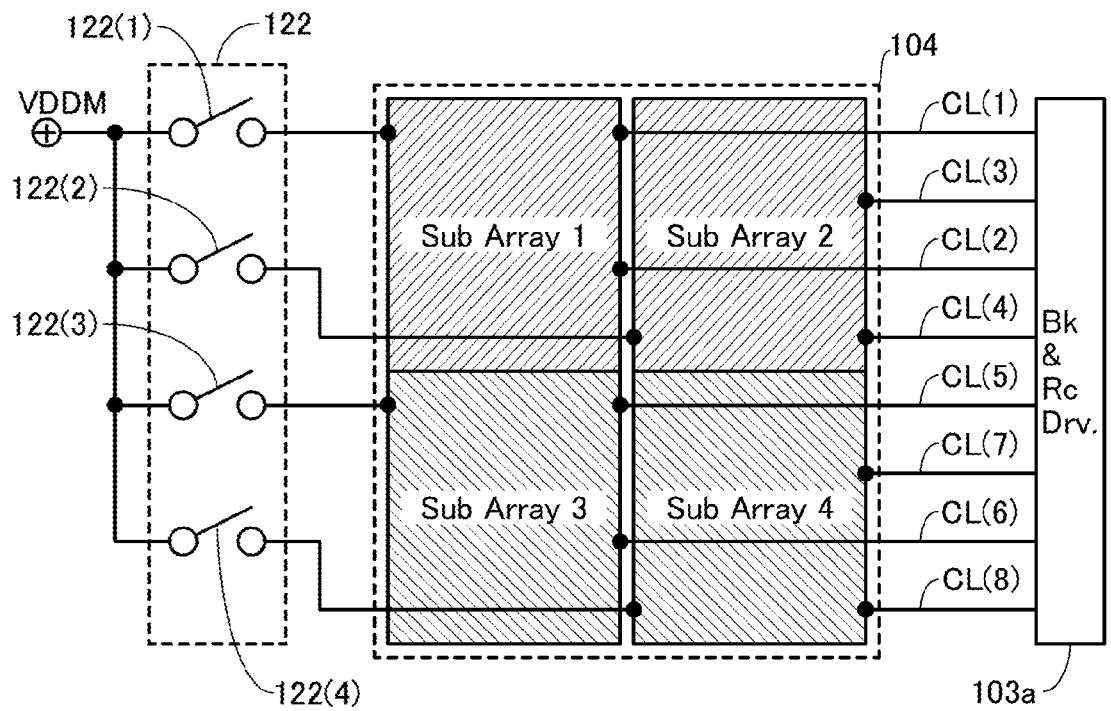

In a configuration shown in FIG. 6A or FIG. 6B, power supply to the sub array 1 is controlled by the power gating switch 122(1) and backup or recovery of the sub array 1 is controlled by a control line CL(1) and a control line CL(2). Similarly, power supply to the sub array 2 is controlled by the power gating switch 122(2) and backup or recovery of the sub array 2 is controlled by a control line CL(3) and a control line CL(4); power supply to the sub array 3 is controlled by a power gating switch 122(3) and backup or recovery of the sub array 3 is controlled by a control line CL(5) and a control line CL(6); and power supply to the sub array 4 is controlled by a power gating switch 122(4) and backup or recovery of the sub array 4 is controlled by a control line CL(7) and a control line CL(8).

Specifically, the sub array 1 is divided into two regions, a sub array 1a and a sub array 1b. Power supply to the sub array 1a and the sub array 1b is controlled by the power gating switch 122(1). Backup or recovery of the sub array 1a is controlled by the control line CL(1) and backup or recovery of the sub array 1b is controlled by the control line CL(2). Similarly, the sub array 2 is divided into two regions, a sub array 2a and a sub array 2b. Power supply to the sub array 2a and the sub array 2b is controlled by the power gating switch 122(2). Backup or recovery of the sub array 2a is controlled by the control line CL(3) and backup or recovery of the sub array 2b is controlled by the control line CL(4).

FIG. 14A shows an example of backup of the memory device shown in FIG. 6A. In this example, one clock after the potential of the control line CL(1) is set to a high level, the potential of the control line CL(2) is set to a high level. One clock after the potential of the control line CL(2) is set to a high level, the potential of the control line CL(3) is set to a high level. One clock after the potential of the control line CL(3) is set to a high level, the potential of the control line CL(4) is set to a high level.

Three clocks after the potential of the control line CL(1) is set to a high level, the potential of the control line CL(1) is set to a low level. One clock after the potential of the control line CL(1) is set to a low level, the potential of the control line CL(2) is set to a low level. One clock after the potential of the control line CL(2) is set to a low level, the potential of the control line CL(3) is set to a low level. One clock after the potential of the control line CL(3) is set to a low level, the potential of the control line CL(4) is set to a low level.

Furthermore, three clocks after the potential of the control line CL(1) is set to a low level (i.e., two clocks after the potential of the control line CL(2) is set to a low level), the power gating signal PG_M(1) is set to a high level, so that the power gating switch 122(1) is turned off. Three clocks after the potential of the control line CL(3) is set to a low level (i.e., two clocks after the potential of the control line CL(4) is set to a low level), the power gating signal PG_M(2) is set to a high level, so that the power gating switch 122(2) is turned off.

Therefore, in each of the sub array 1a, the sub array 1b, the sub array 2a, and the sub array 2b, the period BK includes three clocks and the period SP includes two or three clocks. Specifically, the period SP of each of the sub array 1a and the sub array 2a includes three clocks and that of each of the sub array 1b and the sub array 2b includes two clocks.

Note that for example, in a period of one clock after the potential of the control line CL(1) is set to a low level until the potential of the control line CL(2) is set to a low level, the transistors 109 and 110 of the sub array 1a are not necessarily off. Therefore, the potential of the control line CL(1) in this period is not necessarily low. For example, as shown in FIG. 14B, the potential of the control line CL(1) and the potential of the control line CL(2) may be set to a low level at substantially the same time. In this case, in each of the sub array 1a and the sub array 1b, the period SP includes two clocks, and the period BK of the sub array 1a includes four clocks and that of the sub array 1b includes three clocks. Note that a period between the start of backup of the sub array 1a and the shut down of the sub array 1b is the same as that in FIG. 14A.

Figure 16A:
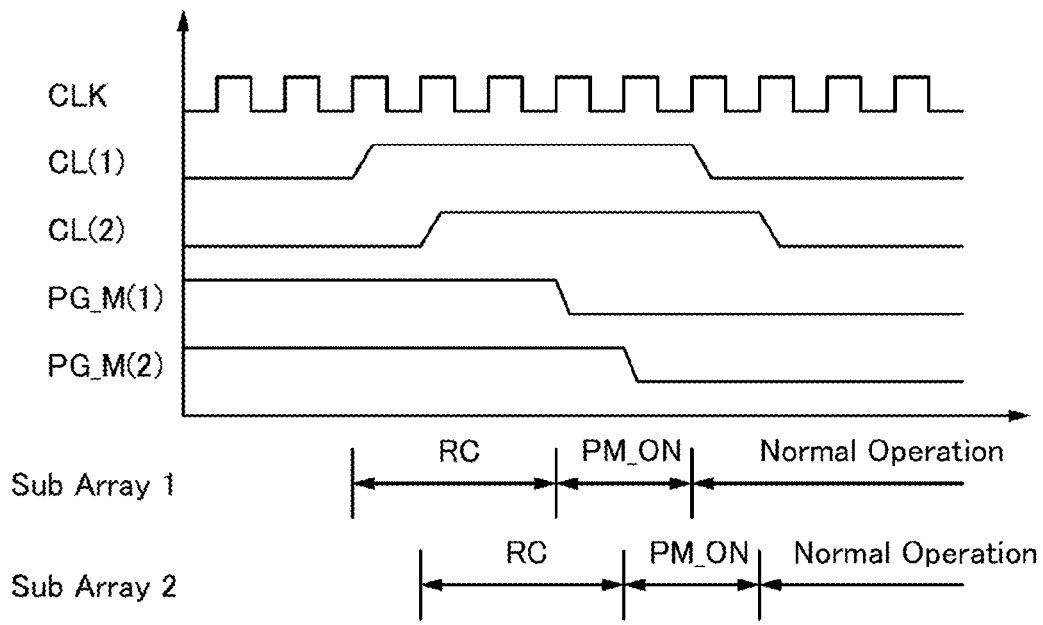
FIGS. 16A and 16B show operation examples of a memory device.
Figure 16B:
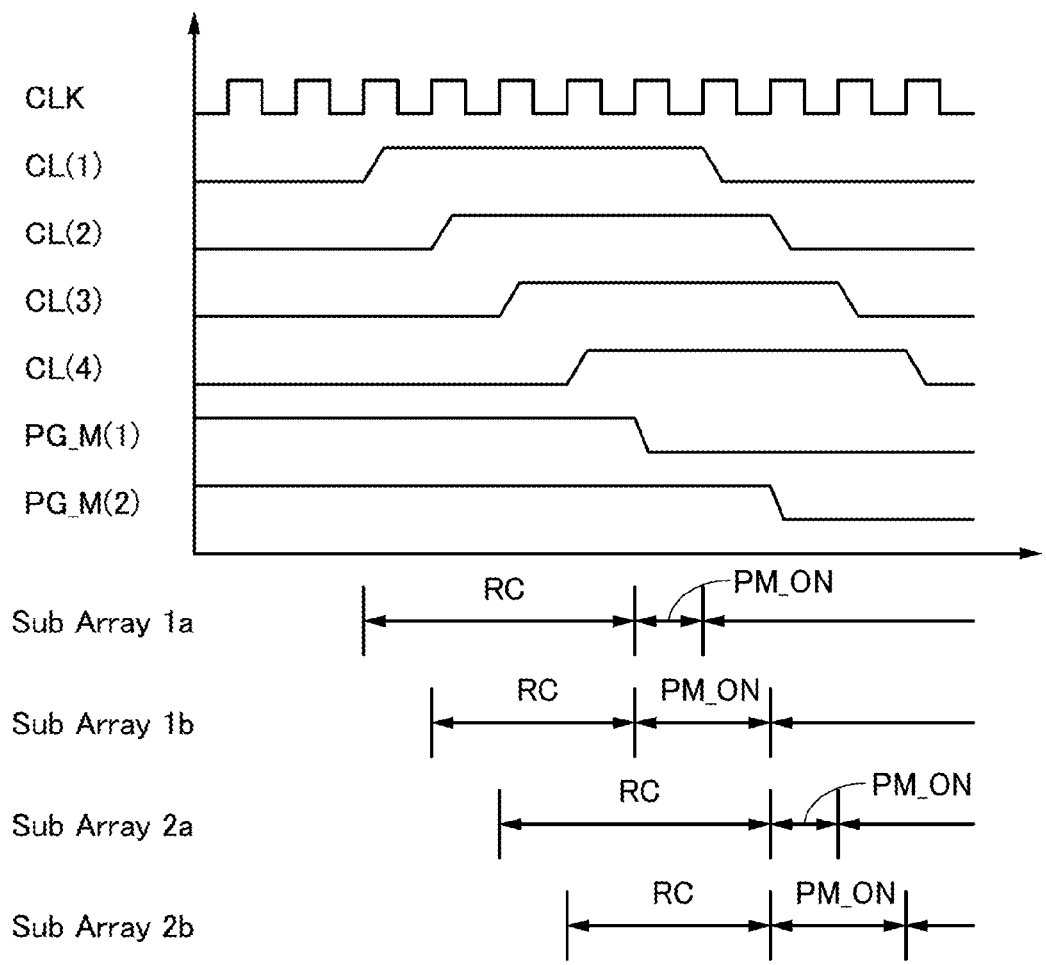

Next, FIG. 16B shows an example of recovery of the memory device shown in FIG. 6A. In this example, one clock after the potential of the control line CL(1) is set to a high level, the potential of the control line CL(2) is set to a high level. One clock after the potential of the control line CL(2) is set to a high level, the potential of the control line CL(3) is set to a high level. One clock after the potential of the control line CL(3) is set to a high level, the potential of the control line CL(4) is set to a high level.

Four clocks after the potential of the control line CL(1) is set to a high level, the potential of the power gating signal PG_M(1) is set to a low level. Four clocks after the potential of the control line CL(3) is set to a high level, the potential of the power gating signal PG_M(2) is set to a low level.

Furthermore, five clocks after the potential of the control line CL(1) is set to a high level, the potential of the control line CL(1) is set to a low level. One clock after the potential of the control line CL(1) is set to a low level, the potential of the control line CL(2) is set to a low level. One clock after the potential of the control line CL(2) is set to a low level, the potential of the control line CL(3) is set to a low level. One clock after the potential of the control line CL(3) is set to a low level, the potential of the control line CL(4) is set to a low level.

Therefore, the period RC of each of the sub array 1*a* and the sub array 2*a* includes four clocks and that of each of the sub array 1*b* and the sub array 2*b* includes three clocks. The period PM_ON of each of the sub array 1*a* and the sub array 2*a* includes one clock and that of each of the sub array 1*b* and the sub array 2*b* includes two clocks.

As in the case in FIG. 14B, for example, in a period of one clock after the potential of the control line CL(1) is set to a low level until the potential of the control line CL(2) is set to a low level, the transistors 109 and 110 of the sub array 1*a* are not necessarily off, and thus the potential of the control line CL(1) in this period is not necessarily low.

Figure 17:
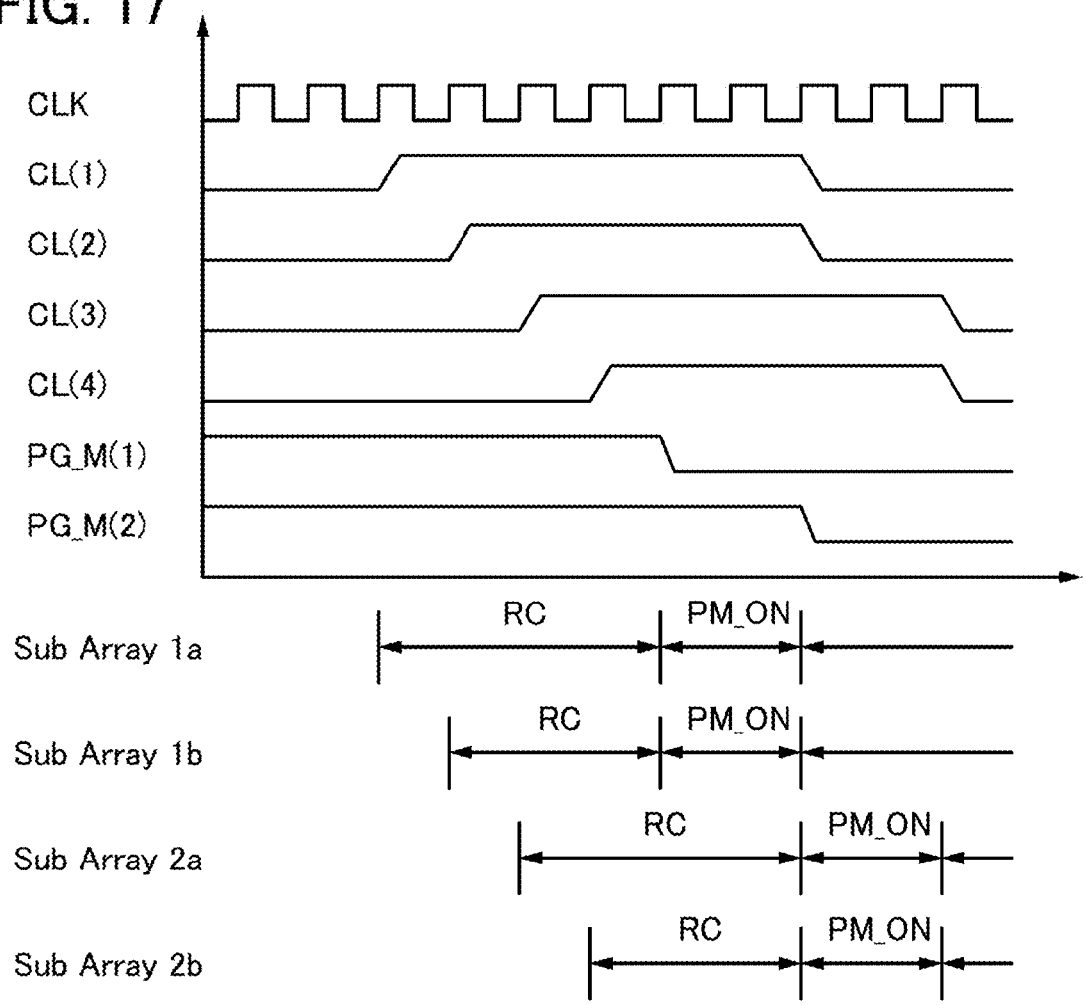
FIG. 17 shows an operation example of a memory device.

For example, as shown in FIG. 17, the potential of the control line CL(1) and the potential of the control line CL(2) may be set to a low level at substantially the same time. In this case, the period PM_ON of each of the sub array 1*a* and the sub array 1*b* includes two clocks and the period RC of the sub array 1*a* includes four clocks and that of the sub array 1*b* includes three clocks. A period between the start of recovery of the sub array 1*a* and normal operation of the sub array 1*b* is the same as that in FIG. 16B.

Although backup and recovery in a memory device including one memory cell array are described above, an arithmetic processing unit includes a plurality of memory cell arrays in some cases. Backup and recovery in that case are described.

Figure 18:
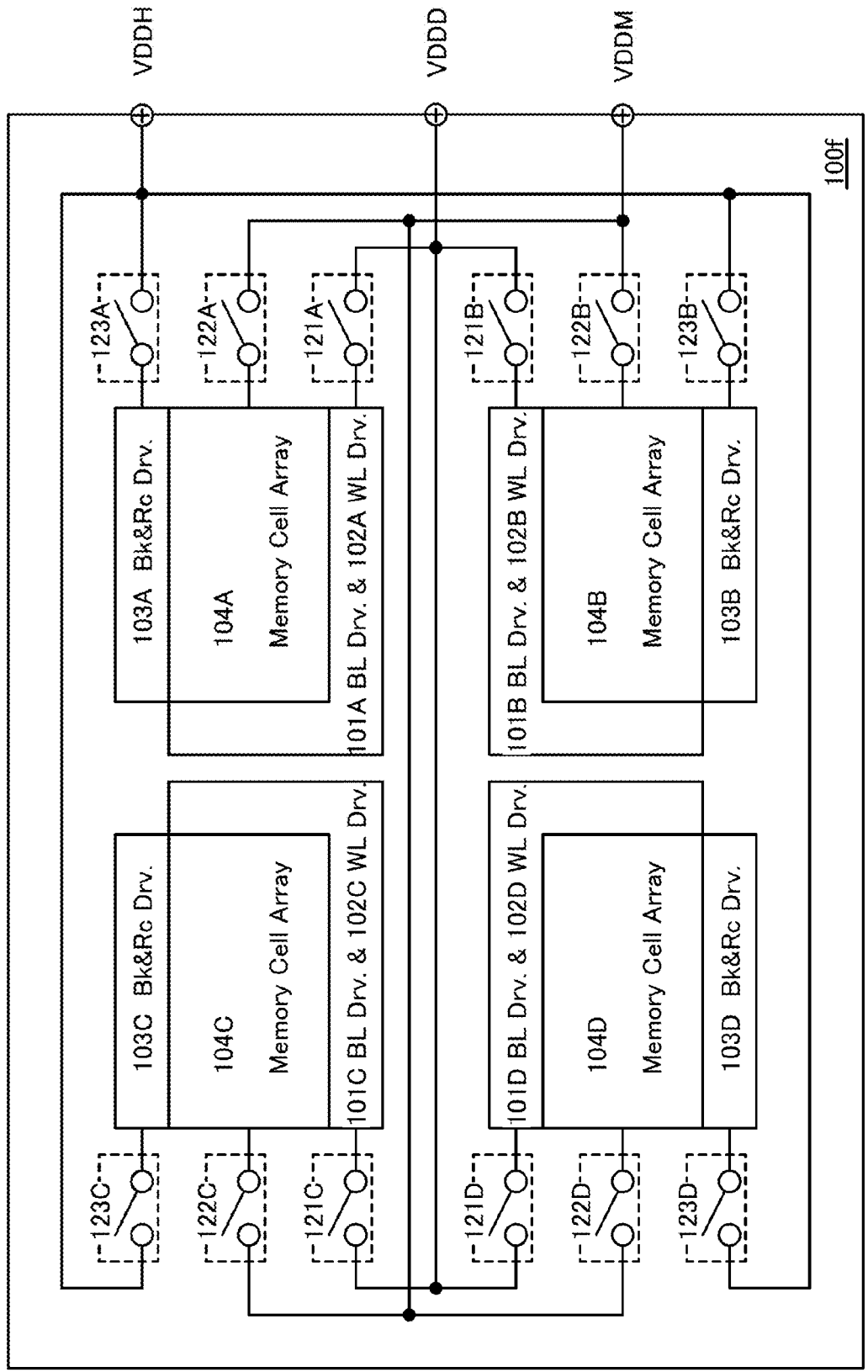
FIG. 18 shows a configuration example of a memory device.

A memory device 100*f* shown in FIG. 18 includes four memory cell arrays (memory cell arrays 104A to 104D), a bit line driver 101A to a bit line driver 101D associated therewith, a word line driver 102A to a word line driver 102D, a backup recovery driver 103A to a backup recovery driver 103D, and the like. The number of memory cell arrays is not limited to four as long as it is two or more.

The bit line driver 101, the word line driver 102, the backup recovery driver 103, and the memory cell array 104 which are described above, or modifications thereof can be applied to these. In addition, a circuit required for operation of the memory cell array, a circuit required for operation of a circuit associated therewith, and the like are provided, although not shown. FIG. 2A can be referred to for them.

The four memory cell arrays and the circuits associated therewith are provided with a power gating switch 121A to a power gating switch 121D, a power gating switch 122A to a power gating switch 122D, and a power gating switch 123A to a power gating switch 123D. For example, the power gating switch 121A to the power gating switch 121D can control power supply to the bit line driver 101A to the bit line driver 101D and the word line driver 102A to the word line driver 102D, respectively. The power gating switches 122A to 122D can control power supply to the memory cell arrays 104A to 104D, and the power gating switches 123A to 123D can control power supply to the backup recovery drivers 103A to 103D.

Note that the potential VDDH, the potential VDDD, the potential VDDM, and the potential VSSS and the potential VSSM which are lower than the potential VDDM are supplied to the memory device 100*f*, though part thereof is not shown in FIG. 18. FIG. 2B may be referred to for the potentials supplied to the memory device 100*f*.

An example of backup and recovery operations of the memory device 100*f* is described. The memory device 100*f* includes a plurality of memory cell arrays (the memory cell arrays 104A to 104D). They each correspond to the sub array described with reference to any one of FIGS. 5A and 5B and FIGS. 6A and 6B and thus can be driven in a manner similar to that of the memory device shown in any one of FIGS. 5A and 5B and FIGS. 6A and 6B.

Here, the memory cell arrays 104A to 104D are connected as illustrated in FIG. 1A. For example, the memory cell arrays 104A to 104D shown in FIG. 18 correspond to the sub arrays 1 to 4 in FIG. 5A or FIG. 5B, and the power gating switches 122A to 122D correspond to the power gating switches 122 (1) to 122(4) in FIG. 5A or FIG. 5B.

It is to be noted that in the circuits shown in FIGS. 5A and 5B, portions corresponding to the power gating switches 121A to 121D and the power gating switches 123A to 123D are not shown, which needs to be noted.

Figure 19:
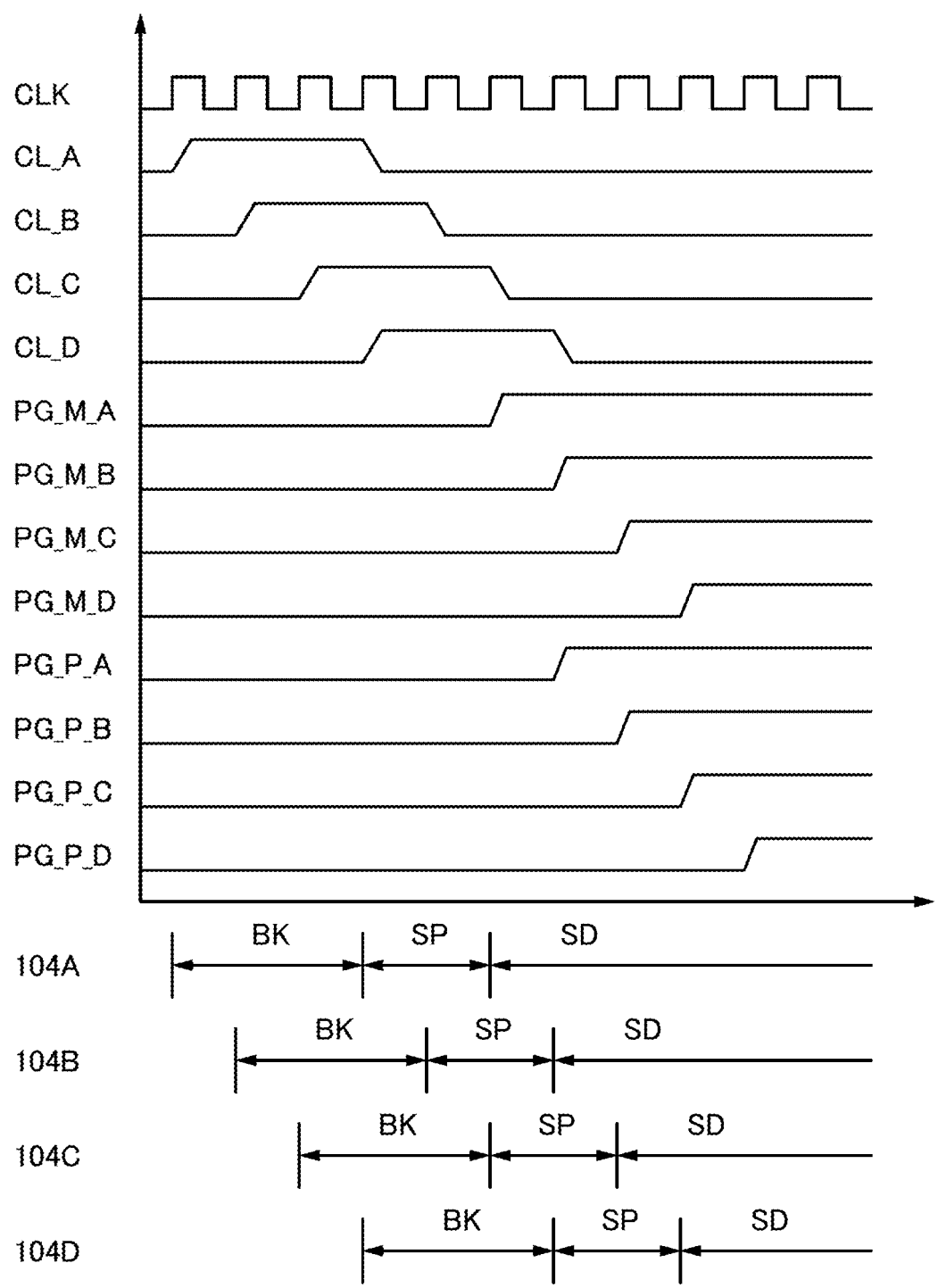
FIG. 19 shows an operation example of a memory device.

FIG. 19 shows an example of backup operation. In FIG. 19, CL_A means a signal potential of a control line of the memory cell array 104A, PG_M_A means a signal potential for controlling the power gating switch 122A, and PG_P_A means a signal potential for controlling the power gating switches 121A and 123A. The same applies to CL_B to CL_D, PG_M_B to PG_M_D, and PG_P_B to PG_P_D.

In FIG. 19, for example, the power gating signal PG_M_A is set to a high level and the power gating signal PG_P_A is set to a high level one clock later; however, as described with reference to FIG. 12B, the power gating signal PG_M_A and the power gating signal PG_P_A may be set to a high level at the same time or the power gating signal PG_P_A may be set to a high level two or more clocks after the power gating signal PG_M_A is set to a high level. Alternatively, after the power gating signal PG_M_D is set to a high level, the power gating signal PG_P_A to the power gating signal PG_P_D may be set to a high level at the same time.

The power gating signal PG_M_A is set to a high level and the power gating signal PG_M_B is set to a high level one clock later; however, as described with reference to FIG. 13B, the power gating signal PG_M_B may be set to a high level two or more clocks after the power gating signal PG_M_A is set to a high level.

FIG. 20 shows an example of recovery operation. In FIG. 20, the signals are sequentially delayed by one clock, e.g., one clock after the power gating signal PG_P_A is set to a low level, the power gating signal PG_P_B is set to a low level; however, the signals may be sequentially delayed by two or more clocks. Alternatively, the power gating signal PG_P_A to the power gating signal PG_P_D may be set to a low level at the same time.

The description is almost the same as the description using FIGS. 16A and 16B except for the power gating signal PG_P_A to the power gating signal PG_P_D and thus is omitted.

Embodiment 2

In this embodiment, a specific device structure of the memory device 100 (or the memory devices 100a to 100e) in Embodiment 1 which is a semiconductor device including an oxide semiconductor transistor (OS transistor) and a single-crystal silicon transistor (Si transistor) will be described.

<Device Structure>

Figures 21A, 21B:
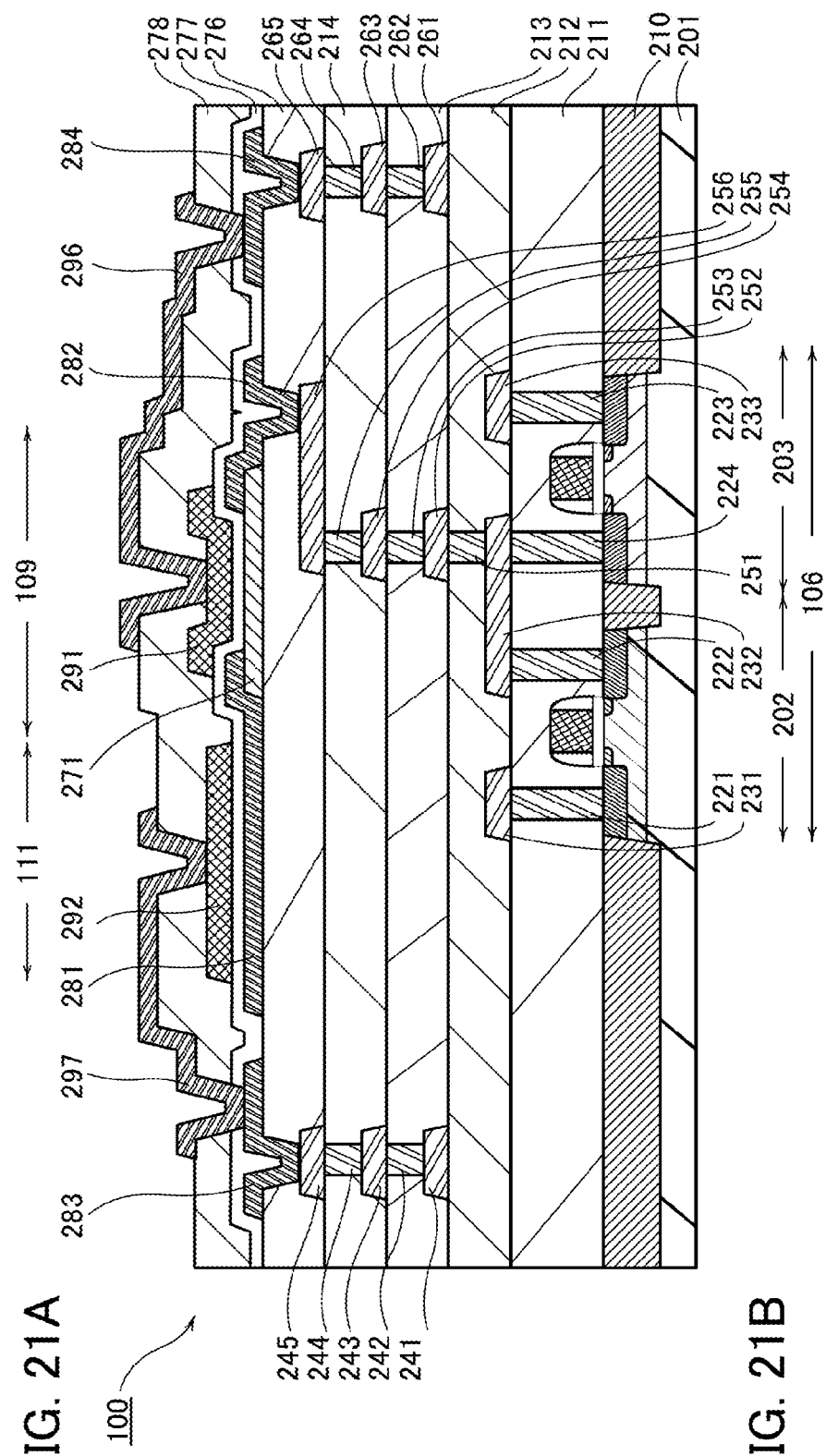
FIGS. 21A and 21B illustrate examples of a cross-sectional structure of a memory device.

FIG. 21A is a cross-sectional view of an example of the device structure of the memory device 100 as a semiconductor device including an OS transistor and a Si transistor. Note that FIG. 21A is a cross-sectional view which is not cut the memory device 100 along a specific line, but explains the layered structure of the memory device 100. The memory device 100 in FIG. 21A includes, for example, the inverter 106, the transistor 109, and the capacitor 111 for forming the memory cell array 104 (or a memory cell MC). A transistor 202 and a transistor 203 are Si transistors for forming the inverter 106. The transistor 202 and the transistor 203 are a p-channel transistor and an n-channel transistor, respectively. The transistor 109 and the capacitor 111 are provided over the inverter 106.

The memory device 100 is formed using a semiconductor substrate. The bulk single-crystal silicon wafer 201 is used as a semiconductor substrate. Note that a substrate for forming a backplane of the memory device 100 is not limited to the bulk single-crystal silicon wafer but can be any of a variety of semiconductor substrates. For example, an SOI semiconductor substrate including a single-crystal silicon layer may be used.

The transistors 202 and 203 can be formed over the single-crystal silicon wafer 201 by a CMOS process. An insulating layer 210 electrically isolates these transistors from each other. An insulating layer 211 is formed so as to cover the transistors 202 and 203. Conductors 231 to 233 are formed over the insulating layer 211. Conductors 221 to 224 are formed in openings formed in the insulating layer 211. As illustrated, a drain of the transistor 202 and a drain of the transistor 203 are connected via the conductors 221 to 224 and the conductors 231 to 233 to form the inverter 106.

One or more wiring layers are formed over the transistors 202 and 203 by the back end of the line (BEOL) process. Insulating layers 212 to 214 and conductors 241 to 245, 251 to 256, and 261 to 265 form three-layered wiring structure.

An insulating layer 276 is formed to cover the wiring layers. The transistor 109 and the capacitor 111 are formed over the insulating layer 276.

The transistor 109 includes an oxide semiconductor layer 271, a conductor 281, a conductor 282, and a conductor 291. The oxide semiconductor layer 271 includes a channel formation region. The conductor 291 serves as a gate electrode. The conductors 281 and 282 serve as a source electrode and a drain electrode, respectively. The conductor 282 is connected to the inverter 106 via the conductors 251 to 256.

Although not illustrated, the conductor 282 is also connected to an input terminal of the inverter 105 (i.e., a gate electrode of a transistor forming the inverter 105).

The capacitor 111 is a MIM capacitor, including the conductor 281 and a conductor 292 as electrodes and the insulating layer 277 as a dielectric (insulating film). The insulating layer 277 also serves as an insulator included in a gate insulating layer of the transistor 109.

An insulating layer 278 is formed to cover the transistor 109 and the capacitor 111. Conductors 296 and 297 are formed over the insulating layer 278. The conductors 296 and 297 are connected to the transistor 109 and the capacitor 111, respectively, and serve as electrodes (wirings) for connecting these elements to the layered wiring structure. For example, as illustrated, the conductor 296 is connected to the conductor 261 by the conductors 262 to 265 and a conductor 284, and the conductor 297 is connected to the conductor 241 by the conductors 242 to 245 and a conductor 283.

The films included in the semiconductor device (i.e., the insulating film, the semiconductor film, the metal oxide film, the conductive film, and the like) can be formed by any of a sputtering method, a chemical vapor deposition (CVD) method, a vacuum evaporation method, and a pulsed laser deposition (PLD) method. A coating method or a printing method can be used. As the CVD method, a plasma-enhanced chemical vapor deposition (PECVD) method or a thermal CVD method is used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Each of the insulating layers of the memory device 100 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film.

Note that in this specification, an oxynitride refers to a substance that contains more oxygen than nitrogen, and a nitride oxide refers to a substance that contains more nitrogen than oxygen.

Each of the conductors of the memory device 100 can be formed using one conductive film or two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

<Another Structure Example of Transistor>

The structures of the Si transistor and the OS transistor included in the semiconductor device are not limited to those in FIG. 21A. For example, the OS transistor may include a back gate.

Alternatively, the OS transistor can have a structure as illustrated in FIG. 21B. In FIG. 21B, the transistor 109 further includes an oxide semiconductor layer 273. A channel is formed in the oxide semiconductor layer 271 also in the transistor 109 of FIG. 21B.

To form the transistor 109 of FIG. 21B, the conductors 281 and 282 are formed and then an oxide semiconductor film for the oxide semiconductor layer 273, an insulating film for the insulating layer 277, and a conductive film for the conductor 291 are stacked. This stacked films are etched using a resist mask for etching the conductive film, and the oxide semiconductor layer 273 and the conductor 291 are formed. Here, a region of the insulating layer 277 which is not covered with the conductor 292 is removed in the capacitor 111.

For example, in the transistor 109 in FIG. 21A, the oxide semiconductor layer 271 is formed of two layers of oxide semiconductor films having different constituent elements. In this case, the lower layer is formed using an In—Zn-based oxide film and the upper layer is formed using an In—Ga—Zn-based oxide film, or each of the lower layer and the upper layer may be formed using an In—Ga—Zn-based oxide film.

For example, in the case where the oxide semiconductor layer 271 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 21B, when the oxide semiconductor layer 271 has a two-layer structure and the oxide semiconductor layer 273 has a single-layer structure, the transistor 109 may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the oxide semiconductor layers 271 and 273 is formed using an In—Ga—Zn-based oxide film, each of the lower layer of the oxide semiconductor layer 271 and the oxide semiconductor layer 273 can be formed using an oxide film with an atomic ratio of In:Ga:Zn=1:3:2, 1:3:4, 1:3:6, 1:6:4, or 1:9:6, and the upper layer of the oxide semiconductor layer 271 can be formed using an oxide film with an atomic ratio of In:Ga:Zn=1:1:1, 5:5:6, or 3:1:2.

FIG. 22 shows another structure example of a Si transistor and an OS transistor.

FIG. 22 is a cross-sectional view showing another structure example of a Si transistor and an OS transistor. In FIG. 22, the cross section A1-A2 shows the Si transistor 202 and the OS transistor 109 in the channel length direction (the direction from the source to the drain), and the cross section A3-A4 shows these transistors in the channel width direction (the direction perpendicular to the channel length direction). Note that in the layout, the channel length direction of the transistor 202 does not necessarily agree with that of the transistor 109. FIG. 22 is for illustrating a cross-sectional structure. In FIG. 22, the OS transistor 109 including a channel formation region in an oxide semiconductor film is formed over the transistor 202 including a single-crystal silicon channel formation region. A single crystal silicon substrate is used as the substrate 300 in FIG. 22. Note that layers with different conductivities or a well may be stacked over the substrate 300.

The transistor 202 is electrically isolated from other semiconductor elements by an element isolation method. As the element isolation method, a trench isolation method (a shallow trench isolation (STI) method) or the like is used. FIG. 22 illustrates an example where the trench isolation method is used to electrically isolate the transistor 202. Specifically, FIG. 22 shows an example in which the transistor 202 is isolated using an element isolation region 301. The element isolation region 301 is formed in the following manner: a trench which is formed in the substrate 300 by etching or the like is filled with an insulator including silicon oxide or the like, and then, the insulator is partially removed by etching or the like.

In a projection of the semiconductor substrate 300 that exists in a region other than the trench, an impurity region 302 and an impurity region 303 of the transistor 202 and a channel formation region 304 placed between the impurity regions 302 and 303 are provided. The transistor 202 also includes an insulating layer 305 covering the channel formation region 304 and a gate electrode 306 that overlaps with the channel formation region 304 with the insulating layer 305 placed therebetween.

In the transistor 202, a side portion and an upper portion of the projection in the channel formation region 304 overlap with the gate electrode 306 with the insulating layer 305 positioned therebetween, so that carriers flow in a wide area including a side portion and an upper portion of the channel formation region 304. Thus, the area of the transistor 202 in the substrate can be small, and the amount of transfer of carriers in the transistor 202 can be increased. As a result, the on-state current of the transistor 202 is increased. Suppose the length of the projection of the channel formation region 304 in the channel width direction (i.e., channel width) is W and the thickness of the projection of the channel formation region 304 is T. When the aspect ratio that corresponds to the ratio of the thickness T to the channel width W is high, a region where carrier flows becomes wider. Thus, the on-state current of the transistor 202 is further increased and the field-effect mobility of the transistor 202 is further increased.

Note that when the transistor 202 is formed using a bulk semiconductor substrate, the aspect ratio is desirably 0.5 or more, more desirably 1 or more.

An insulating layer 311 is provided over the transistor 202. Openings are formed in the insulating layer 311. A conductor 312, a conductor 313, and a conductor 314 that are electrically connected to the impurity region 302, the impurity region 303, and the gate electrode 306, respectively, are formed in the openings. The conductor 312 is electrically connected to a conductor 316 over the insulating layer 311. The conductor 313 is electrically connected to a conductor 317 over the insulating layer 311. The conductor 314 is electrically connected to a conductor 318 over the insulating layer 311.

An insulating layer 320 is provided over the conductors 316 to 318. An insulating layer 321 having an effect of blocking diffusion of oxygen, hydrogen, and water is provided over the insulating layer 320. An insulating layer 322 is provided over the insulating layer 321. The transistor 109 is provided over the insulating layer 322.

As the insulating layer 321 has higher density and becomes denser or has a fewer dangling bonds and becomes more chemically stable, the insulating layer 321 has a higher blocking effect. The insulating layer 321 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating layer 321 having an effect of blocking diffusion of hydrogen and water can be formed using silicon nitride or silicon nitride oxide, for example.

The transistor 109 includes an oxide semiconductor layer 330, conductors 332 and 333 in contact with the oxide semiconductor layer 330, an insulating layer 331 covering the oxide semiconductor layer 330, and a gate electrode 334 that overlaps with the oxide semiconductor layer 330 with the insulating layer 331 placed therebetween. The conductors 332 and 333 function as source and drain electrodes. The conductor 333 is connected to the conductor 318 in an opening formed in the insulating layers 320 to 332.

Although not illustrated, an insulating layer may be provided over the transistor 109. In this case, it is possible that an opening is formed in the insulating layer and a conductor that is in contact with the gate electrode 334 in the opening is provided over the insulating layer.

Note that in FIG. 22, the transistor 109 includes the gate electrode 334 on at least one side of the oxide semiconductor layer 330. The transistor 109 may also include a gate electrode that overlaps with the oxide semiconductor layer 330 with the insulating layer 322 placed therebetween.

When the transistor 109 includes a pair of gate electrodes, one of the gate electrodes may be supplied with a signal for controlling the on/off state, and the other of the gate electrodes may be supplied with another potential independently of the one of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 22, the transistor 109 has a single-gate structure where one channel formation region corresponding to one gate electrode 334 is provided. When a plurality of gate electrodes electrically connected to each other are provided in the transistor 109, for example, the transistor 109 can have a multi-channel structure where a plurality of channel formation regions are included in one oxide semiconductor layer.

FIG. 22 is an example in which the oxide semiconductor layer 330 of the transistor 109 has a three-layered structure of oxide semiconductor layers 330a to 330c. The side surfaces of the oxide semiconductor layers 330a and 330b are covered with the oxide semiconductor layer 330c. Note that one or two of the oxide semiconductor layers 330a to 330c may be omitted. For example, the oxide semiconductor layer 330 of the transistor 109 may be a single-layered metal oxide film.

Embodiment 3

Oxide Semiconductor

In this embodiment, the oxide semiconductor used in the OS transistor will be described.

The channel formation region of the OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1\times10^{17}/cm^3$. The carrier density is preferably lower than $1\times10^{15}/cm^3$, further preferably lower than $1\times10^{13}/cm^3$.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity level becomes a trap, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor. The purified OS has any of the following impurity concentration levels.

For example, in the case where the impurity includes silicon, the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$.

For example, in the case where the impurity includes hydrogen, the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$.

For example, in the case where the impurity includes nitrogen, the concentration of nitrogen is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/$cm^3$, preferably lower than $5\times10^{18}$ atoms/$cm^3$, further preferably lower than $1\times10^{18}$ atoms/$cm^3$. For example, the concentration of carbon is set lower than $1\times10^{19}$ atoms/$cm^3$, preferably lower than $5\times10^{18}$ atoms/$cm^3$, further preferably lower than $1\times10^{18}$ atoms/$cm^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor having an appropriate composition may be formed in accordance with needed electrical characteristics (e.g., field-effect mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn-based oxide is formed by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor (relative density) of such a target is preferably higher than or equal to 90%, further preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 15:1 to 1.5:1 (the molar ratio of $In_2O_3$:ZnO=3:4 to 15:2). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

A structure of the oxide semiconductor film is described below. In the following description of a crystal structure, the term "parallel" indicates that the angle formed between two straight lines is greater than or equal to −10° and less than or equal to 10°, and accordingly also includes the case where the angle is greater than or equal to −5° and less than or equal to 5°. The term "substantially perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is an oxide semiconductor film including a plurality of c-axis aligned crystal parts.

In a transmission electron microscope (TEM) image of the CAAC-OS film, a boundary between crystal parts, that is, a clear grain boundary is not observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 23A is a cross-sectional TEM image of a CAAC-OS film. FIG. 23B is a cross-sectional TEM image obtained by enlarging the image of FIG. 23A. In FIG. 23B, atomic arrangement is highlighted for easy understanding.

FIG. 23C is Fourier transform images of regions each surrounded by a circle (the diameter is approximately 4 nm) between A and O and between 0 and A' in FIG. 23A. C-axis alignment can be observed in each region in FIG. 23C. The c-axis direction between A and O is different from that between 0 and A', which indicates that a grain in the region between A and O is different from that between 0 and A'. In addition, between A and O, the angle of the c-axis continuously and gradually changes from 14.3°, 16.6°, to 30.9°. Similarly, between 0 and A', the angle of the c-axis continuously changes from −18.3°, −17.6°, to −11.3°.

Figure 24A:
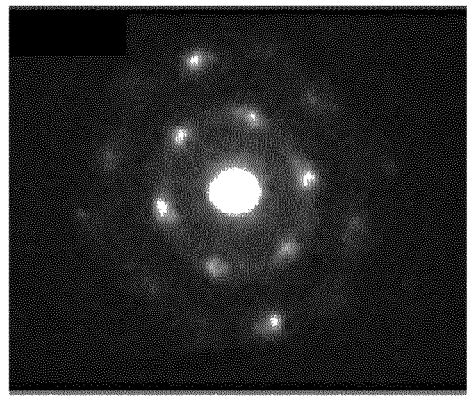
FIGS. 24A to 24D illustrate examples of structures of oxide semiconductors.

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 24A).

From the results of the cross-sectional TEM image and the plan TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 $nm^2$, larger than or equal to 5 $\mu m^2$, or larger than or equal to 1000 $\mu m^2$ is observed in some cases in the planar TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the InGaZnO4 crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak do not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In an OS transistor including the CAAC-OS film, changes in electrical characteristics of the transistor due to irradiation with visible light or ultraviolet light are small. Thus, the transistor has high reliability.

<Microcrystalline Oxide Semiconductor Film>

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

Figure 24B:
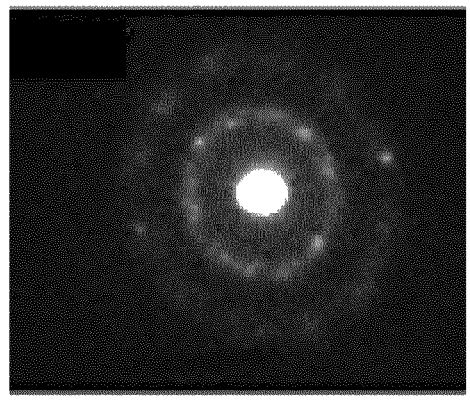

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 24B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the oxide semiconductor film is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a diffraction pattern different from that of a CAAC-OS film is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 24C:
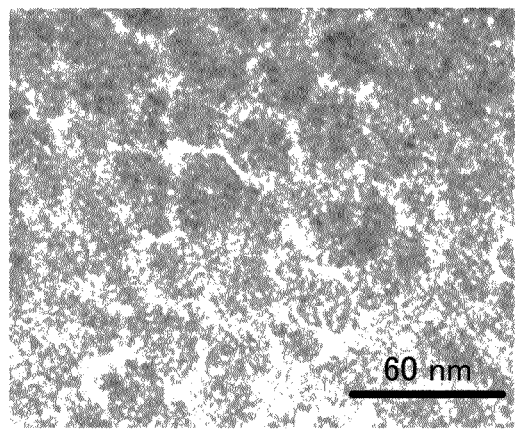
Figure 24D:
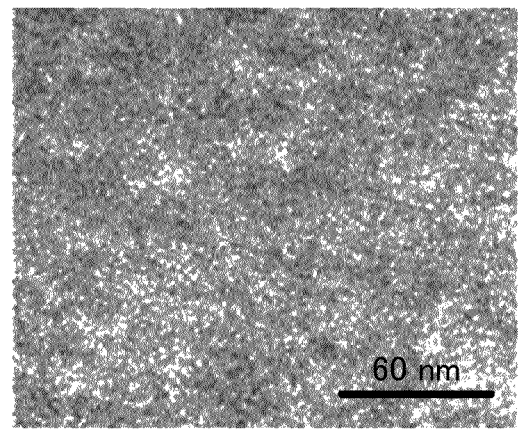

FIGS. 24C and 24D are planar TEM images of the CAAC-OS film obtained just after the deposition (as-sputtered) and the CAAC-OS film subjected to the heat treatment at 450° C., respectively. Comparison between FIGS. 24C and 24D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 4

The above-described arithmetic processing unit including a memory device can be used for various semiconductor devices and electronic appliances. Examples of such electronic devices are display devices, personal computers, and image reproducing devices provided with recording media (devices that read image data of recording media such as digital versatile discs (DVDs) and have displays for displaying images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 25A to 25F each illustrate specific examples of these electronic devices.

Figure 25A:
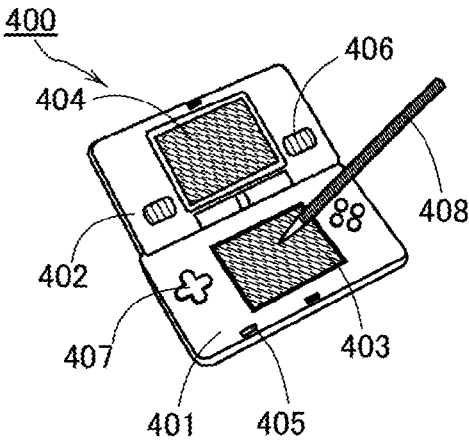
FIGS. 25A to 25F illustrate electronic devices each including an arithmetic processing unit.

FIG. 25A is an external view illustrating a structure example of a portable game machine. A portable game machine 400 includes a housing 401, a housing 402, a display portion 403, a display portion 404, a microphone 405, speakers 406, an operation key 407, a stylus 408, and the like.

Figure 25B:
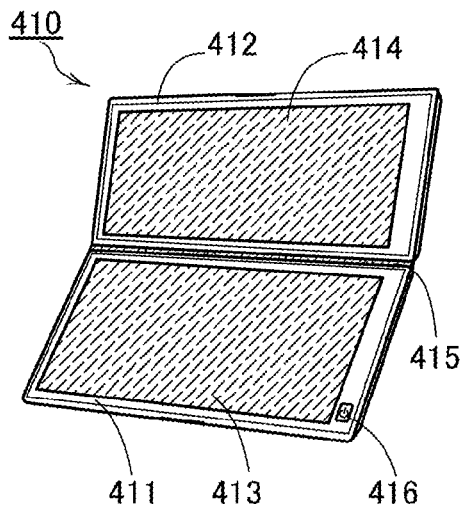

FIG. 25B is an external view illustrating a structure example of a portable information terminal. A portable information terminal 410 includes a housing 411, a housing 412, a display portion 413, a display portion 414, a joint 415, an operation key 416, and the like. The display portion 413 is provided in the housing 411, and the display portion 414 is provided in the housing 412. The housings 411 and 412 are connected to each other with the joint 415, and an angle between the housings 411 and 412 can be changed with the joint 415. Images displayed on the display portion 413 may be switched in accordance with the angle at the joint 415 between the housing 411 and the housing 412. Note that the display portion 413 and/or the display portion 414 may be touch panels.

Figure 25C:
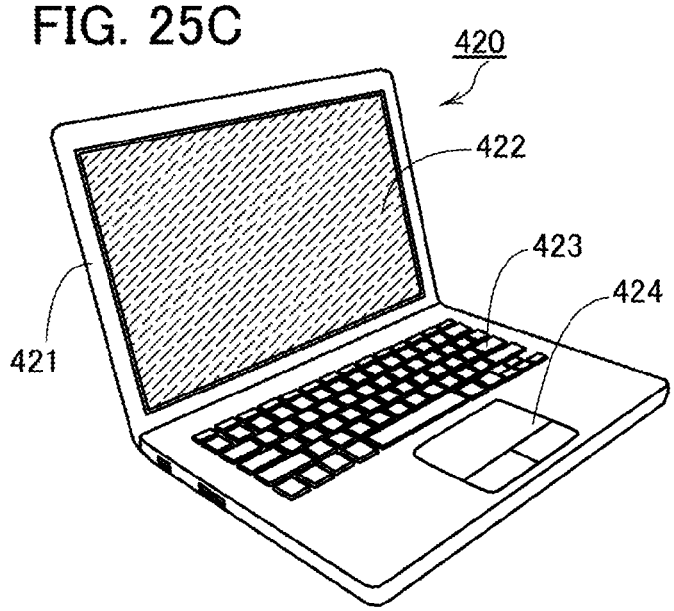

FIG. 25C is an external view illustrating a structure example of a laptop. A personal computer 420 includes a housing 421, a display portion 422, a keyboard 423, a pointing device 424, and the like.

Figure 25D:
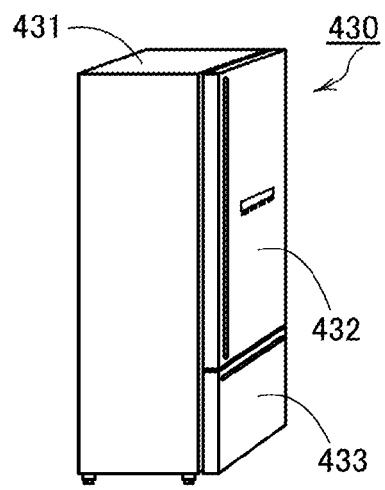

FIG. 25D is an external view illustrating a structure example of an electric refrigerator-freezer. The electric refrigerator-freezer 430 includes a housing 431, a refrigerator door 432, a freezer door 433, and the like.

Figure 25E:
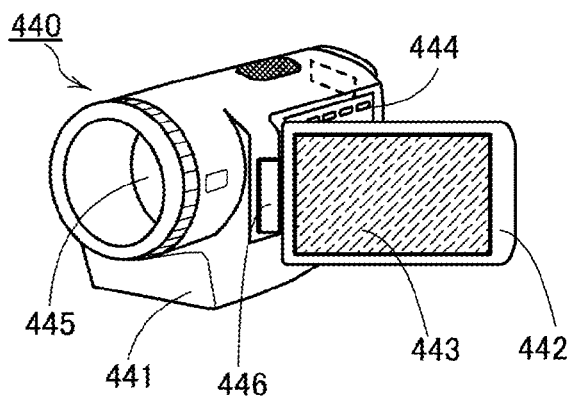

FIG. 25E is an external view illustrating a structure example of a video camera. The video camera 440 includes a housing 441, a housing 442, a display portion 443, operation keys 444, a lens 445, a joint 446, and the like. The operation keys 444 and the lens 445 are provided in the housing 441, and the display portion 443 is provided in the housing 442. The housing 441 and the housing 442 are connected to each other with the joint 446, and an angle between the housing 441 and the housing 442 can be changed with the joint 446. The direction of an image on the display portion 443 may be changed and display and non-display of an image may be switched depending on the angle between the housing 441 and the housing 442.

Figure 25F:
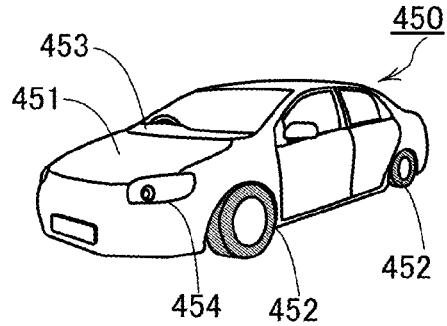

FIG. 25F is an external view illustrating a structure example of a motor vehicle. The motor vehicle 450 includes a car body 451, wheels 452, a dashboard 453, lights 454, and the like.

The memory device in the above embodiments can be used for a cache memory, a main memory, or storage of various kinds of arithmetic processing unit (e.g., a CPU, a microcontroller, a programmable device such as FPGA, and an RFID tag).

This implementation can be implemented in appropriate combination with any of the other implementations and the like.

This application is based on Japanese Patent Application serial no. 2013-215208 filed with Japan Patent Office on Oct. 16, 2013, the entire contents of which are hereby incorporated by reference.

What is claimed is:

1. A method for driving an arithmetic processing unit, the arithmetic processing unit including a first memory cell and a second memory cell, the first memory cell and the second memory cell each including: a transistor; a capacitor; a first inverter an output of which is input to the capacitor through the transistor; and a second inverter an output of which is directly or indirectly input to the first inverter and an input of which is directly or indirectly output from the first inverter, the method comprising the steps of:
   turning on the transistor of the first memory cell at a first time;
   stopping power supply to at least one of the first inverter and the second inverter of the first memory cell at a second time;
   turning on the transistor of the second memory cell at a third time; and
   stopping power supply to at least one of the first inverter and the second inverter of the second memory cell at a fourth time,
   wherein the first time is earlier than the third time, and
   wherein the second time is earlier than the fourth time.

2. The method according to claim 1, further comprising the steps of:
   turning off the transistor of the first memory cell between the first time and the second time; and
   turning off the transistor of the second memory cell between the third time and the fourth time.

3. The method according to claim 1, wherein the second time is later than the third time and earlier than the fourth time.

4. The method according to claim 1,
   wherein the transistor of the first memory cell and the transistor of the second memory cell include an oxide semiconductor, and
   wherein a channel formation region is in the oxide semiconductor.

5. The method according to claim 1,
   wherein the transistor of the first memory cell and the transistor of the second memory cell include a semiconductor film, and
   wherein a channel formation region is in the semiconductor film.

6. The method according to claim 1, further comprising the steps of:
   turning on a transistor of a third memory cell at a fifth time; and
   turning on a transistor of a fourth memory cell at a sixth time,
   wherein power supply to at least one of a first inverter and a second inverter of the third memory cell is stopped at the second time,
   wherein power supply to at least one of a first inverter and a second inverter of the fourth memory cell is stopped at the fourth time,
   wherein the fifth time is earlier than the third time,
   wherein the sixth time is earlier than the fourth time, and
   wherein, in each of the third memory cell and the fourth memory cell, an output of the first inverter is input to a capacitor through the transistor, and an output of the second inverter is directly or indirectly input to the first inverter and an input of the second inverter is directly or indirectly input from the first inverter.

7. A method for driving an arithmetic processing unit, the arithmetic processing unit including a first memory cell and a second memory cell, the first memory cell and the second memory cell each including: a transistor; a capacitor; a first inverter an output of which is input to the capacitor through the transistor; and a second inverter an output of which is directly or indirectly input to the first inverter and an input of which is directly or indirectly output from the first inverter, the method comprising the steps of:
   turning on the transistor of the first memory cell at a first time;
   starting power supply to at least one of the first inverter and the second inverter of the first memory cell at a second time;
   turning on the transistor of the second memory cell at a third time; and
   starting power supply to at least one of the first inverter and the second inverter of the second memory cell at a fourth time,
   wherein the first time is earlier than the third time, and
   wherein the second time is earlier than the fourth time.

8. The method according to claim 7, further comprising the steps of:
   turning off the transistor of the first memory cell after the second time; and
   turning off the transistor of the second memory cell after the fourth time.

9. The method according to claim 7, wherein the second time is later than the third time and earlier than the fourth time.

10. The method according to claim 7,
    wherein the transistor of the first memory cell and the transistor of the second memory cell include an oxide semiconductor, and
    wherein a channel formation region is in the oxide semiconductor.

11. The method according to claim 7,
    wherein the transistor of the first memory cell and the transistor of the second memory cell include a semiconductor film, and
    wherein a channel formation region is in the semiconductor film.

12. The method according to claim 7, further comprising the steps of:
    turning on a transistor of a third memory cell at a fifth time; and
    turning on a transistor of a fourth memory cell at a sixth time,
    wherein power supply to at least one of a first inverter and a second inverter of the third memory cell is started at the second time,
    wherein power supply to at least one of a first inverter and a second inverter of the fourth memory cell is started at the fourth time,
    wherein the fifth time is earlier than the third time,
    wherein the sixth time is earlier than the fourth time, and
    wherein, in each of the third memory cell and the fourth memory cell, an output of the first inverter is input to a capacitor through the transistor, and an output of the second inverter is directly or indirectly input to the first inverter and an input of the second inverter is directly or indirectly input from the first inverter.

13. A method for driving an arithmetic processing unit, the arithmetic processing unit including a first memory cell and a second memory cell, the first memory cell and the second memory cell each including: a transistor; a capacitor; a first inverter an output of which is input to the capacitor through the transistor; and a second inverter an output of which is directly or indirectly input to the first inverter and an input of which is directly or indirectly output from the first inverter, the method comprising the steps of:

turning on the transistor of the first memory cell at a first time, stopping power supply to at least one of the first inverter and the second inverter of the first memory cell at a second time;

turning on the transistor of the second memory cell at a third time;

stopping power supply to at least one of the first inverter and the second inverter of the second memory cell at a fourth time;

turning on the transistor of the first memory cell at a fifth time;

starting power supply to at least one of the first inverter and the second inverter of the first memory cell at a sixth time;

turning on the transistor of the second memory cell at a seventh time; and starting power supply to at least one of the first inverter and the second inverter of the second memory cell at an eighth time, wherein the first time is earlier than the third time,
wherein the second time is earlier than the fourth time,
wherein the fifth time is earlier than the seventh time, and
wherein the sixth time is earlier than the eighth time.

14. The method according to claim 13, further comprising the steps of:

turning off the transistor of the first memory cell between the first time and the second time;

turning off the transistor of the second memory cell between the third time and the fourth time;

turning off the transistor of the first memory cell after the sixth time; and turning off the transistor of the second memory cell after the eighth time.

15. The method according to claim 13,
wherein the second time is later than the third time and earlier than the fourth time, and
wherein the sixth time is later than the seventh time and earlier than the eighth time.

16. The method according to claim 13,
wherein the transistor of the first memory cell and the transistor of the second memory cell include an oxide semiconductor, and
wherein a channel formation region is in the oxide semiconductor.

17. The method according to claim 13,
wherein the transistor of the first memory cell and the transistor of the second memory cell include a semiconductor film, and
wherein a channel formation region is in the semiconductor film.

18. The method according to claim 13, further comprising the steps of:

turning on a transistor of a third memory cell at a ninth time;

turning on a transistor of a fourth memory cell at a tenth time;

turning on the transistor of the third memory cell at an eleventh time; and turning on the transistor of the fourth memory cell at a twelfth time, wherein power supply to at least one of a first inverter and a second inverter of the third memory cell is stopped at the second time, wherein power supply to at least one of a first inverter and a second inverter of the fourth memory cell is stopped at the fourth time, wherein power supply to at least one of a first inverter and a second inverter of the third memory cell is started at the sixth time, wherein power supply to at least one of a first inverter and a second inverter of the fourth memory cell is started at the eighth time, wherein the ninth time is earlier than the third time,
wherein the tenth time is earlier than the fourth time,
wherein the eleventh time is earlier than the seventh time,
wherein the twelfth time is earlier than the eighth time, and
wherein, in each of the third memory cell and the fourth memory cell, an output of the first inverter is input to a capacitor through the transistor, and an output of the second inverter is directly or indirectly input to the first inverter and an input of the second inverter is directly or indirectly input from the first inverter.

* * * * *